(12) United States Patent
Kawachi

(10) Patent No.: US 11,727,889 B2
(45) Date of Patent: Aug. 15, 2023

(54) DISPLAY DEVICE

(71) Applicant: Wuhan Tianma Micro-Electronics Co., Ltd., Wuhan (CN)

(72) Inventor: Genshiro Kawachi, Kanagawa (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 17/544,564

(22) Filed: Dec. 7, 2021

(65) Prior Publication Data

US 2022/0199040 A1 Jun. 23, 2022

(30) Foreign Application Priority Data

Dec. 23, 2020 (JP) .................................. 2020-213259

(51) Int. Cl.
*G09G 3/3291* (2016.01)
*G09G 3/3233* (2016.01)
*G09G 3/3266* (2016.01)
*G11C 19/28* (2006.01)

(52) U.S. Cl.
CPC ......... *G09G 3/3291* (2013.01); *G09G 3/3233* (2013.01); *G09G 3/3266* (2013.01); *G09G 2310/0286* (2013.01); *G09G 2330/021* (2013.01); *G11C 19/28* (2013.01)

(58) Field of Classification Search
None
See application file for complete search history.

(56) References Cited

U.S. PATENT DOCUMENTS

| | | | | |
|---|---|---|---|---|
| 5,285,117 | A * | 2/1994 | Furutani | H03K 19/003 326/62 |
| 5,986,626 | A * | 11/1999 | Tanaka | G09G 3/22 313/495 |
| 2003/0206608 | A1* | 11/2003 | Kawahata | G11C 19/28 377/64 |
| 2005/0264493 | A1 | 12/2005 | Shin | |
| 2005/0264496 | A1* | 12/2005 | Shin | G09G 3/3233 345/76 |
| 2005/0285827 | A1* | 12/2005 | Eom | G09G 3/3266 345/76 |
| 2006/0038754 | A1* | 2/2006 | Kim | G09G 3/3233 345/76 |
| 2006/0156121 | A1* | 7/2006 | Chung | G09G 3/3233 714/726 |
| 2007/0040786 | A1 | 2/2007 | Chung | |
| 2007/0240024 | A1* | 10/2007 | Shin | G09G 3/325 714/726 |

(Continued)

*Primary Examiner* — Dorothy Harris
(74) *Attorney, Agent, or Firm* — Sughrue Mion, PLLC

(57) ABSTRACT

Each of latch circuits outputs a pulse of a first kind of signal to a pixel circuit row. Shift register units serially output pulses of a second kind of signal. Each of the latch circuits receives the pulse of the second kind of signal from a first shift register unit and the pulse of the second kind of signal from a second shift register unit of a later stage than the first shift register unit. The pulse of the first kind of signal from each of the latch circuits changes from a first potential level to a second potential level in response to the pulse of the second kind of signal from the first shift register unit and changes from the second potential level to the first potential level in response to the pulse of the second kind of signal from the second shift register unit.

11 Claims, 19 Drawing Sheets

(56) References Cited

U.S. PATENT DOCUMENTS

| | | | |
|---|---|---|---|
| 2012/0081409 A1* | 4/2012 | Chung | G09G 3/3266 |
| | | | 327/108 |
| 2013/0135278 A1* | 5/2013 | Toyotaka | G11C 19/28 |
| | | | 345/55 |
| 2013/0200367 A1* | 8/2013 | Yamazaki | H01L 29/7869 |
| | | | 257/43 |
| 2016/0140904 A1* | 5/2016 | Wu | G09G 3/3233 |
| | | | 345/78 |
| 2016/0372046 A1 | 12/2016 | Wang et al. | |
| 2021/0174743 A1* | 6/2021 | Chang | G09G 3/3258 |

* cited by examiner

TRUTH TABLE

| SET | RST | Q |
|-----|-----|---|
| L | L | L |
| H | L | H (HOLD) |
| L | H | L |
| H | H | L (NOT ALLOWED) |

DISPLAY DEVICE

CROSS-REFERENCE TO RELATED APPLICATIONS

This non-provisional application claims priority under 35 U.S.C. § 119(a) on Patent Application No. 2020-213259 filed in Japan on Dec. 23, 2020, the entire content of which is hereby incorporated by reference.

BACKGROUND

This disclosure relates to a display device.

An organic light-emitting diode (OLED) element is a current-driven self-light-emitting element and therefore, does not need a backlight. In addition to this, the OLED element has advantages for achievement of low power consumption, wide viewing angle, and high contrast ratio; it is expected to contribute to development of flat panel display devices.

An active-matrix (AM) OLED display device includes transistors for selecting pixels and driving transistors for supplying electric current to the pixels. The transistors in an OLED display device are thin-film transistors (TFTs); commonly, low-temperature polysilicon (LTPS) TFTs are used.

The TFTs have variations in their threshold voltage and charge mobility. Since the driving transistors determine the light emission intensity of the OLED display device, their variations in electrical characteristics could cause a problem. Hence, a typical OLED display device includes a correction circuit for compensating for the variations and shifts of the threshold voltage of the driving transistors.

An OLED display device could show a ghost image and this phenomenon is called image retention. For example, in displaying a full-screen image of an intermediate emission level after displaying a black and white checkerboard pattern for a specific period, the OLED display device displays a ghost image of the checkerboard pattern of different emission levels for a while.

This is caused by hysteresis effect of the driving transistors. The hysteresis effect causes a phenomenon in a field-effect transistor such that the drain current flows differently between the case where the gate-source voltage changes from a high voltage to a low voltage and the case where the gate-source voltage changes from the low voltage to the high voltage.

That is to say, the drain current flows differently between the pixels whose emission level is changed from the black level to an intermediate level and the pixels whose emission level is changed from the white level to the intermediate level. For this reason, the OLED display device emits different intensities of light. This difference in drain current continues over several frames and therefore, the difference in intensity of emitted light is perceived as a ghost.

SUMMARY

A display device according to an aspect of this disclosure includes: a display region including a plurality of pixel circuit rows; a shift register including a plurality of shift register units connected in series; and a plurality of latch circuits configured to output signal pulses to the plurality of pixel circuit rows in accordance with a signal input from the shift register. Each of the plurality of latch circuits is configured to output a pulse of a first kind of signal to a pixel circuit row associated with the latch circuit. The plurality of shift register units are configured to serially output pulses of a second kind of signal. Each of the plurality of latch circuits is configured to receive the pulse of the second kind of signal from a first shift register unit and the pulse of the second kind of signal from a second shift register unit of a later stage than the first shift register unit. The pulse of the first kind of signal from each of the plurality of latch circuits changes from a first potential level to a second potential level in response to the pulse of the second kind of signal from the first shift register unit and changes from the second potential level to the first potential level in response to the pulse of the second kind of signal from the second shift register unit.

A display device according to another aspect of this disclosure includes: a display region; and a driving circuit for the display region disposed outside the display region. The display region includes: a plurality of pixel circuits; and a plurality of first control lines, a plurality of second control lines, a plurality of signal lines, and a plurality of power lines connected with the plurality of pixel circuits. Each of the plurality of pixel circuits includes: a light-emitting element; a plurality of switch transistors of a first conductive type; an emission control transistor of a second conductive type, the emission control transistor being configured to control ON/OFF of light emission of the light-emitting element; a driving transistor of the second conductive type, the driving transistor being configured to control amount of electric current to the light-emitting element; and a storage capacitor connected with the driving transistor. The plurality of first control lines are configured to transmit a first control signal from the driving circuit to the plurality of switch transistors of the first conductive type. The plurality of second control lines are configured to transmit a second control signal from the driving circuit to the emission control transistors of the second conductive type. The driving circuit includes a plurality of transistors, a plurality of capacitors, and a plurality of connection lines. All transistors included in the driving circuit are transistors of the first conductive type.

It is to be understood that both the foregoing general description and the following detailed description are exemplary and explanatory and are not restrictive of this disclosure.

EMBODIMENTS

Figure 1:
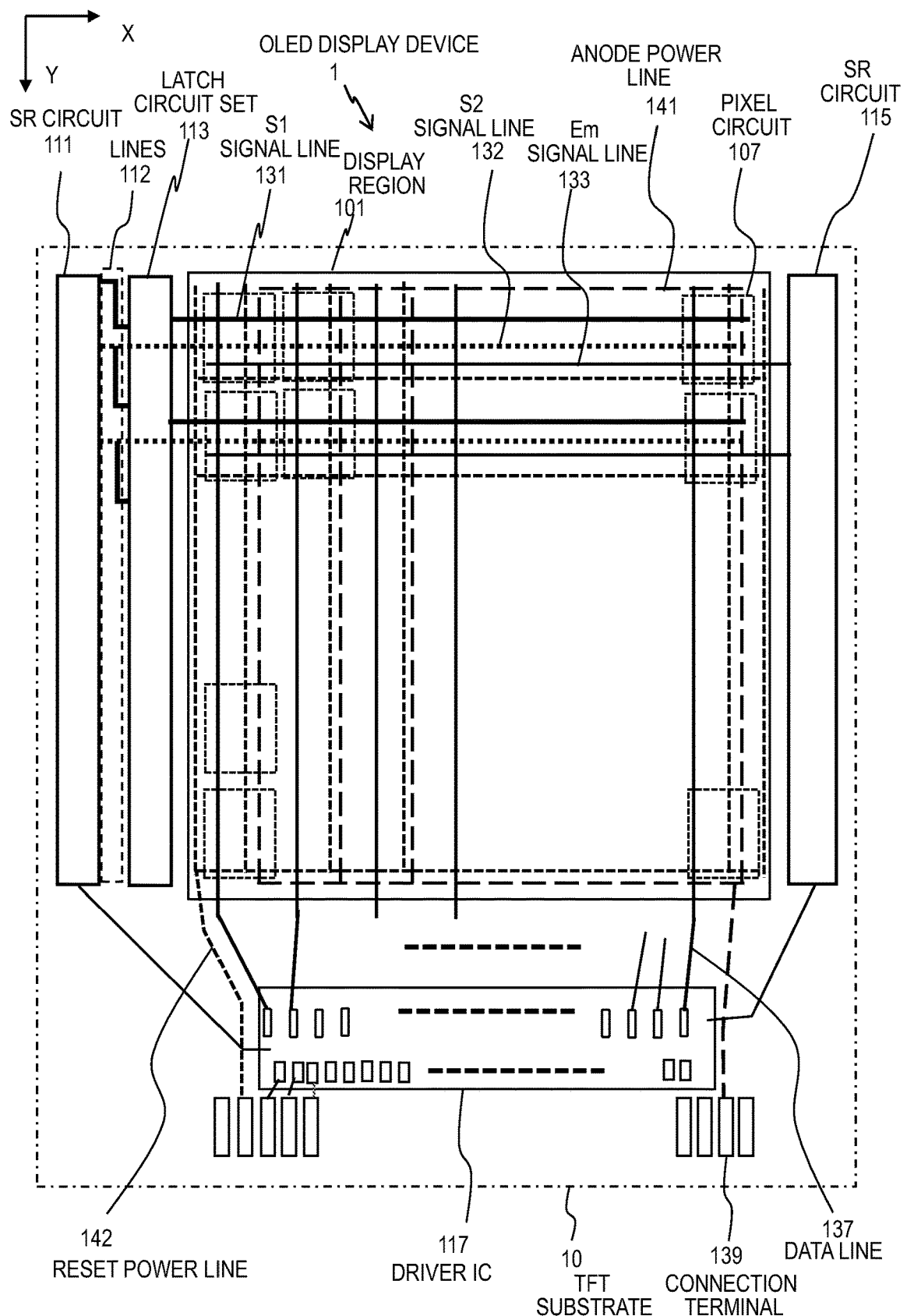
FIG. 1 schematically illustrates a configuration example of a thin-film transistor (TFT) substrate of an OLED display device and control circuits mounted on the TFT substrate.

Hereinafter, embodiments of this disclosure will be described with reference to the accompanying drawings. Elements common to the drawings are denoted by the same reference signs and each element in the drawings may be exaggerated in size and/or shape for clear understanding of the description.

Disclosed hereinafter are configurations of a circuit for generating and outputting control signals for pixel circuits in a light-emitting type of display device including light-emitting elements that emit light in response to driving current, such as an organic light emitting diode (OLED) display device. A display device in an embodiment of this specification generates and outputs control signals for controlling pixel circuits with a combination of a shift register circuit and a plurality of latch circuits. A circuit for outputting signal pulses having desired pulse widths can be designed easily with a combination of a shift register circuit and a plurality of latch circuits.

For example, image retention can be reduced by taking a long time for threshold voltage compensation of driving TFTs. A long threshold voltage compensation period can be attained by performing the threshold voltage compensation in a period different from the period of data write. A combination of a shift register circuit and a plurality of latch circuits can easily generate a control signal about data write periods and a control signal about threshold voltage compensation periods.

A shift register circuit includes a plurality of shift register units connected in series. For example, each shift register unit outputs a control signal about data write periods to the associated pixel circuit row. Each latch circuit receives this control signal from two different shift register units and outputs a control signal about threshold voltage compensation periods to the associated pixel circuit row. This configuration does not need a shift register circuit for the control signal about threshold voltage compensation periods and therefore, smaller circuit area can be achieved.

In another example, a combination of a shift register circuit and a plurality of latch circuits can generate and output an emission control signal for controlling ON/OFF of light emission of light-emitting elements. Each latch circuit receives a signal from two different shift register units and outputs an emission control signal to the associated pixel circuit row. This configuration enables designing a driver circuit for generating emission control signals easily.

The combination of a shift register circuit and a plurality of latch circuits can generate and output a data write signal in addition to the emission control signal. Each shift register unit outputs a control signal about data write periods to the associated pixel circuit row. Each latch circuit receives the data write control signal from two different shift register units and outputs an emission control signal to the associated pixel circuit row.

Configuration of Display Device

Hereinafter, embodiments of this specification are described more specifically. FIG. 1 schematically illustrates a configuration example of a thin-film transistor (TFT) substrate of an OLED display device and control circuits mounted on the TFT substrate. In FIG. 1, only one of the components of the same kind is provided with a reference sign. An OLED display device 1 includes a TFT substrate 10 on which organic light-emitting elements (OLED elements) and pixel circuits are fabricated and a not-shown thin-film encapsulation (TFE) for encapsulating the OLED elements.

The thin-film encapsulation is an example of a structural encapsulation unit. Another example of structural encapsulation unit can include an encapsulation substrate for encapsulating the OLED elements and a bond (glass frit sealer) for bonding the TFT substrate with the encapsulation substrate. The space between the TFT substrate and the encapsulation substrate is filled with dry nitrogen, for example.

The TFT substrate 10 includes an insulating substrate; a display region 101 for displaying an image is fabricated on the insulating substrate. A first shift register (SR) circuit 111, a latch circuit set 113, a second shift register circuit 115, and a driver IC 117 are disposed outside the display region 101. In FIG. 1, the shift register circuit 111 is disposed on the left side of the display region 101 and the shift register circuit 115 is disposed on the right side of the display region 101; these shift register circuits are opposed to each other. Lines 112 connecting the shift register circuit 111 and the latch circuit set 113 are provided in the space therebetween.

The driver IC 117 is connected to the external devices via not-shown flexible printed circuits (FPC). The connection terminals of the FPC are interconnected with connection terminals 139 on the TFT substrate 10.

The first shift register circuit 111 drives S2 signal lines 132 on the TFT substrate 10. The S2 signal lines 132 are disposed to extend along the X-axis from the shift register circuit 111 and lie one above another along the Y-axis. In FIG. 1, the S2 signal lines 132 are represented by dotted lines. The shift register circuit 111 outputs pulses of a control signal S2 serially to the S2 signal lines 132. The latch circuit set 113 drives S1 signal lines 131 on the TFT substrate 10. The S1 signal lines 131 are disposed to extend along the X-axis from the latch circuit set 113 and lie one above another along the Y-axis. The latch circuit set 113 outputs pulses of a control signal S1 serially to the S1 signal lines 131. The control signals S1 and S2 will be described later.

The second shift register circuit 115 drives emission signal lines (Em signal lines) 133 to control light emission periods of the pixels. The Em signal lines 133 are disposed to extend along the X-axis from the shift register circuit 115 and lie one above another along the Y-axis. The shift register circuit 115 outputs pulses of an Em signal (emission control signal) serially to the Em signal lines 133. The Em signal will be described later.

The driver IC 117 is mounted with an anisotropic conductive film (ACF), for example. The driver IC 117 supplies power and timing signals (control signals) to the shift register circuits 111 and 115. The driver IC 117 outputs a data signal specifying the brightness of the pixels to data lines 137. In the configuration example of FIG. 1, the data lines 137 are disposed to extend along the Y-axis and lie side by side along the X-axis. The driver IC 117 supplies each data line 137 with a data signal specifying a brightness level for a selected OLED element.

The display region 101 includes a plurality of pixel circuits 107 for controlling light emission of OLED elements of a plurality of pixels. In the configuration example of FIG. 1, the pixel circuits are disposed in a matrix. The layout of the pixel circuits is not limited to a specific one. In a multi-color OLED display device, each OLED element emits light of one of the colors of red, blue, and green, for example. The plurality of pixel circuits constitute a pixel circuit array.

Each pixel circuit row composed of a plurality of pixel circuits is connected with an S1 signal line 131, an S2 signal line 132, and an Em signal line 133. The S1 signal line 131, the S2 signal line 132, and the Em signal line 133 transmit the control signal S1, the control signal S2, and the control signal Em, respectively, to the associated pixel circuit row. Each data line 137 is connected with one pixel circuit column. Each pixel circuit column is connected with one pixel circuit in each pixel circuit row. The data line 137 transmits a data signal specifying a light emission level to the pixel circuit in the selected pixel circuit row.

An anode power line 141 and a reset power line 142 are disposed on the TFT substrate 10. The anode power line 141 transmits a power supply potential to be supplied to the anode of each OLED element. In FIG. 1, the anode power line 141 is represented by a long-dashed line and its pattern includes lines extending along the X-axis and a plurality of lines extending along the Y-axis and disposed side by side along the X-axis. The lines extending along the Y-axis are connected with the lines extending along the X-axis.

The reset power line 142 transmits a power supply potential for resetting the potential of a specific node in each pixel circuit. In FIG. 1, the reset power line 142 is represented by a dashed line and its pattern includes lines extending along the X-axis and a plurality of lines extending along the Y-axis and disposed side by side along the X-axis. The lines extending along the Y-axis are connected with the lines extending along the X-axis. These power supply potentials can be supplied from an external power supply circuit or a power supply circuit in the driver IC 117. FIG. 1 does not include some of the power lines to be described with reference to FIG. 2.

As will be described later, each pixel circuit includes a driving TFT (driving transistor) and a storage capacitor for holding a signal voltage to determine the driving current for the driving TFT. The data signal transmitted by a data line 137 is adjusted and stored (written) to the storage capacitor.

The voltage of the storage capacitor determines the gate voltage (Vgs) of the driving TFT. The adjusted data signal alters the conductance of the driving TFT in an analog manner to supply a forward bias current corresponding to a light emission level to the OLED element.

Configuration of Pixel Circuit

Figure 2:
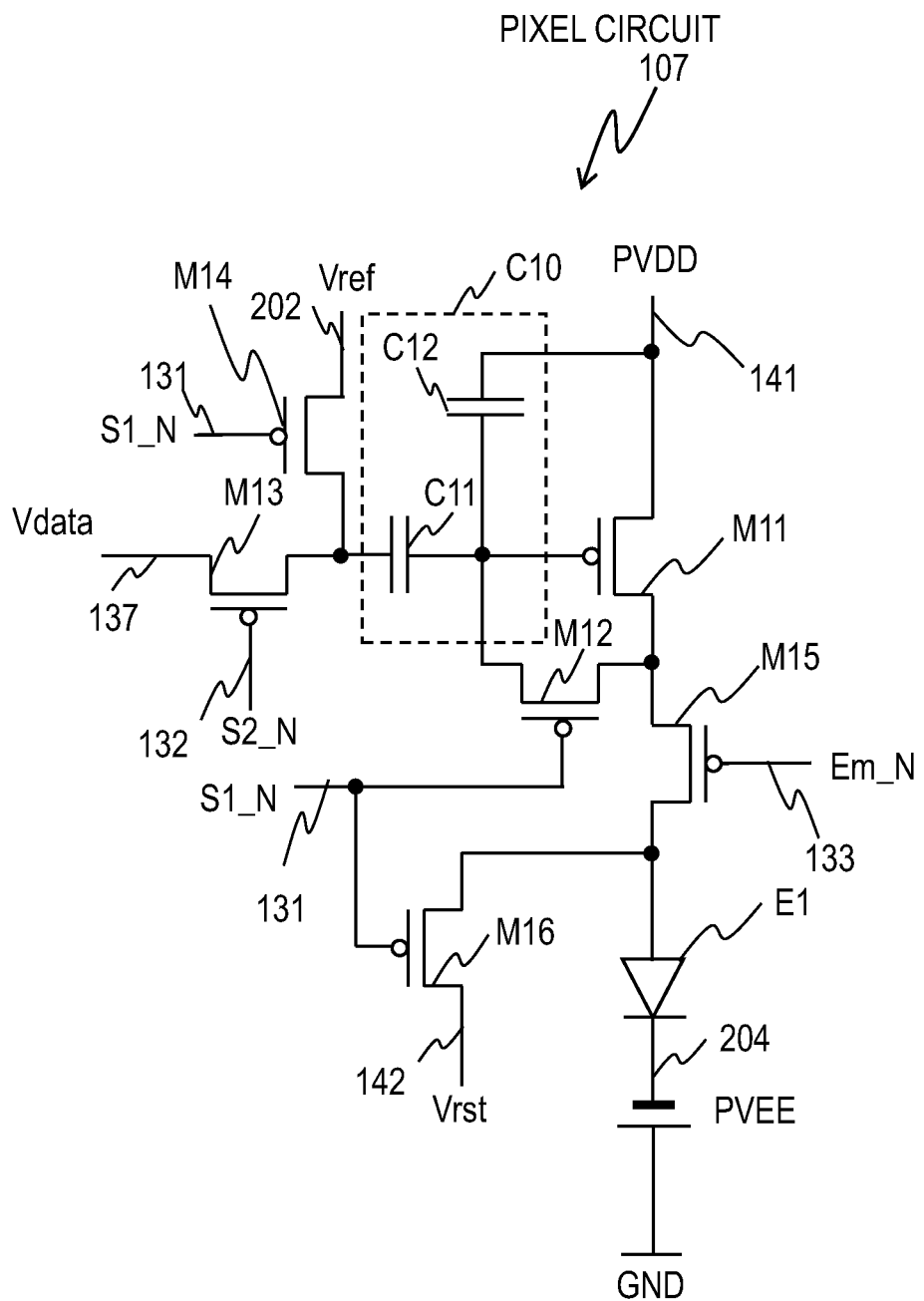
FIG. 2 illustrates a configuration example of a pixel circuit in an embodiment.

FIG. 2 illustrates a configuration example of a pixel circuit 107 in an embodiment. The pixel circuit 107 is included in an N-th pixel circuit row (N is an integer). The pixel circuit 107 includes six transistors (TFTs) M11 to M16 each having a gate, a source, and a drain. All transistors M11 to M16 in this example are p-type TFTs.

The transistor M11 is a driving transistor for controlling the amount of electric current to an OLED element E1. The driving transistor M11 controls the amount of electric current to be supplied from an anode power supply supplying a power supply potential PVDD to the OLED element E1 in accordance with a voltage stored in a storage capacitor C10. The storage capacitor C10 holds a written voltage throughout one frame period. The cathode of the OLED element E1 is connected with a power line 204 for transmitting a power supply potential PVEE from a cathode power supply.

The storage capacitor C10 in the configuration example of FIG. 2 consists of capacitors C11 and C12 connected in series. One end of the storage capacitor C10 is supplied with the anode power supply potential PVDD and another end is connected with the sources/drains of the switch transistors M13 and M14. Still another end of the storage capacitor C10 is connected with the gate of the driving transistor M11. More specifically, an end of the capacitor C12 is connected with the anode power line 141; an end of the capacitor C11 is connected with the sources/drains of the switch transistors M13 and M14; and an intermediate node between the capacitors C11 and C12 is connected with the gate of the driving transistor M11.

The voltage of the storage capacitor C10 is a voltage between the gate of the driving transistor M11 and the anode power line 141. The source of the driving transistor M11 is connected with the anode power line 141; the source potential is the anode power supply potential PVDD. Accordingly, the storage capacitor C10 stores the voltage between the gate and the source of the driving transistor M11. In the configuration example of FIG. 2, the capacitor C12 holds the gate-source voltage of the driving transistor M11.

The transistor M15 is a switch transistor for controlling ON/OFF of light emission of the OLED element E1. The source of the transistor M15 is connected with the drain of the driving transistor M11. The transistor M15 switches ON/OFF the current supply to the OLED element E1 connected from the drain. The gate of the transistor M15 is connected with an Em signal line (emission control line) 133 and the transistor M15 is controlled by the emission control signal Em input from the shift register circuit 115 to its gate.

The transistor M16 works to supply a reset potential Vrst to the anode of the OLED element E1. One end of the source/drain of the transistor M16 is connected with a power line 142 for transmitting the reset potential Vrst and the other end is connected with the anode of the OLED element E1.

The gate of the transistor M16 is connected with an S1 signal line 131 and the transistor M16 is controlled by the control signal S1. When the transistor M16 is turned ON by the control signal S1 input from the latch circuit set 113 to its gate, the transistor M16 supplies the reset potential Vrst transmitted by the power line 142 to the anode of the OLED element E1. The transistor M16 also has a function to bypass the current flowing in from the power supply PVDD via the M11 and M15 during the reset period to prevent leak emission, while supplying the reset potential Vrst to the anode of the OLED element E1.

The transistor M12 is a switch transistor for writing a voltage for correcting (compensating) the threshold voltage of the driving transistor M11 to the storage capacitor C10 and for resetting the gate potential of the driving transistor M11. The source and the drain of the transistor M12 connect the gate and the drain of the driving transistor M11. Accordingly, when the transistor M12 is ON, the driving transistor M11 is diode connected.

The transistor M14 is a switch transistor for writing a voltage for compensating the threshold voltage of the driving transistor M11 to the storage capacitor C10. The transistor M14 controls whether to supply a reference potential Vref to the storage capacitor C10. One end of the source/drain of the transistor M14 is connected with a power line 202 for transmitting the reference potential Vref and the other end is connected with an end of the capacitor C11. The gate of the transistor M14 is connected with the S1 signal line 131 and the transistor M14 is controlled by the control signal S1 input from the latch circuit set 113 to its gate.

The transistors M12, M16, and M14 are controlled by the control signal S1. Accordingly, these transistors M12, M16, and M14 are turned ON/OFF simultaneously. During the period while these transistors are ON, when the emission control transistor M15 is turned ON, the gate potential of the driving transistor M11 is reset, and subsequently, the emission control transistor M15 is turned OFF. When the transistors M12 and M14 are ON, the transistor M11 is a diode-connected transistor. A threshold compensation voltage between the power supply potential PVDD and the reference potential Vref is written to the storage capacitor C10.

The transistor M13 is a switch transistor for selecting a pixel circuit to be supplied with a data signal and writing the data signal (data signal voltage) to the storage capacitor C10. One end of the source/drain of the transistor M13 is connected with a data line 137 for transmitting a data signal Vdata and the other end is connected with the storage capacitor C10, more specifically, an end of the capacitor C11.

The gate of the transistor M13 is connected with an S2 signal line 132 for transmitting a control signal S2 for selecting a pixel circuit row to write a data signal. The transistor M13 is controlled by the control signal S2 supplied from the shift register circuit 111. When the transistor M13 is ON, the transistor M13 supplies the data signal Vdata supplied from the driver IC 117 through the data line 137 to the storage capacitor C10.

Figure 3:
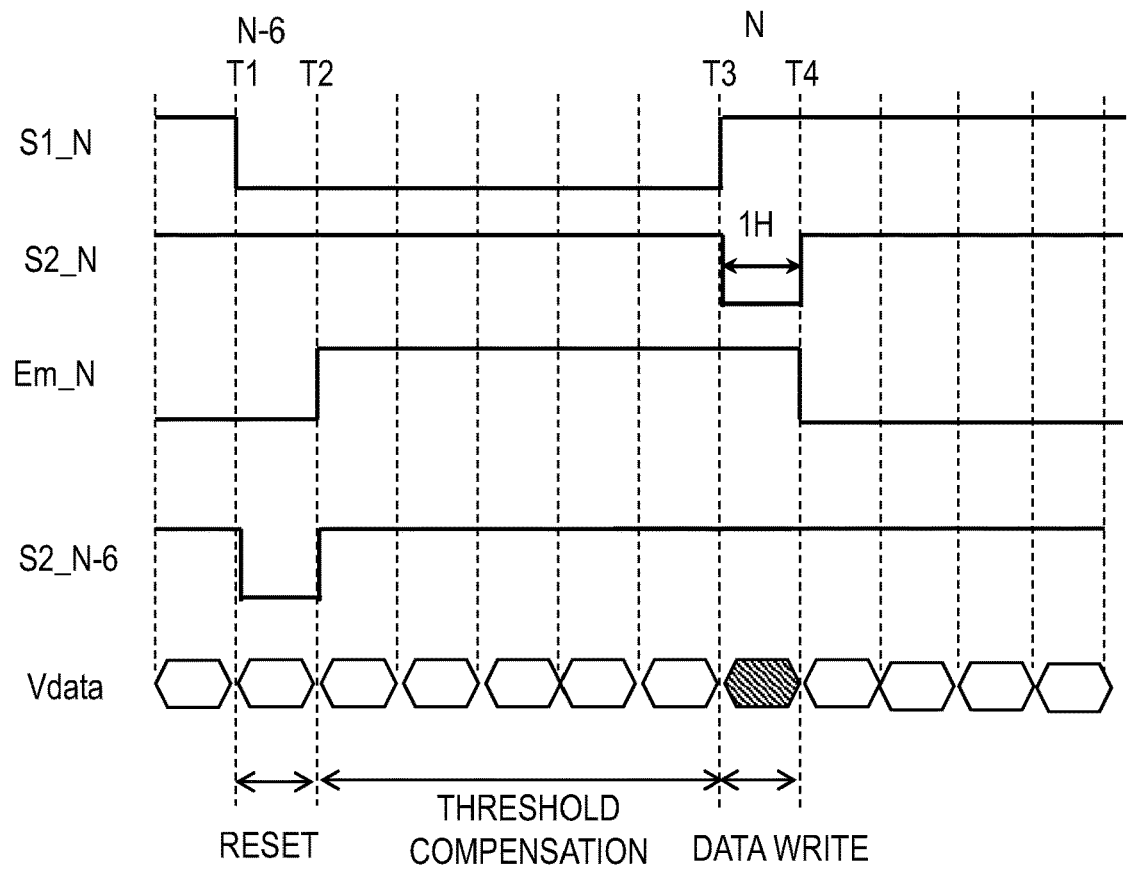
FIG. 3 is an example of a timing chart of the signals for controlling the pixel circuit illustrated in FIG. 2.

FIG. 3 is an example of a timing chart of the signals for controlling the pixel circuit 107 in FIG. 2. FIG. 3 is a timing chart to write a threshold compensation voltage for the driving transistor M11 and a data signal Vdata to a pixel circuit in the N-th pixel circuit row. Specifically, FIG. 3 illustrates temporal variation in one frame of the selection signals S1_N and S2_N for selecting the N-th pixel circuit row to write a data signal Vdata, the emission control signal Em_N for the N-th pixel circuit row, and the selection signal S2_N−6 for selecting the (N−6)th pixel circuit row. FIG. 3 shows variation in signal potential level of those signals. The selection signals are a kind of control signals and can be referred to as scanning signals.

The period of 1 H in the timing chart of FIG. 3 is a period to write a data signal Vdata to a pixel circuit and a period in which the selection signal S2 is Low. A threshold compensation period is longer than 1 H and in the example of FIG. 3, 5H.

At a time T1, the selection signal S2_N−6 changes from High to Low. As will be described later, the selection signal S1_N changes from High to Low in response to the change of the selection signal S2_N−6. The transistors M12, M14, and M16 turn ON in response to the change of the selection signal S1_N. Since the emission control signal Em_N is Low at the time T1, the transistor M15 is ON.

Since the transistors M12 and M14 to M16 are ON, the reset potential Vrst is supplied to the anode of the OLED element E1 and in addition, to the gate of the driving transistor M11. At a time T2, the emission control signal Em_N changes from Low to High. The period from the time T1 to the time T2 is a period to reset the gate voltage of the driving transistor M11. The selection signal S2_N−6 also changes from Low to High at the time T2. The period from the time T1 to the time T2 is a period to write a data signal to the (N−6)th pixel circuit row. The period from the time T1 to the time T2 has a length of 1 H.

The potential levels of the signals S1_N, S2_N, Em_N, and S2_N−6 are maintained from the time T2 to a time T3. The transistors M12, M14, and M16 are ON and the other transistors including the transistor M15 are OFF. A threshold compensation voltage is written to the storage capacitor C10 during this period from the time T2 to the time T3. The period from the time T2 to the time T3 is a threshold compensation period and has a length of 5H.

At the time T3, the selection signal S2_N changes from High to Low. As will be described later, the selection signal S1_N changes from Low to High in response to the change of the selection signal S2_N. The transistor M12, M14, and M16 turn OFF in response to the change of the selection signal S1_N. The selection signal S1_N is maintained to be High after the time T3.

Further, the transistor M13 turns from OFF to ON in response to the change of the selection signal S2_N. As a result, a data signal Vdata is started to be written to the storage capacitor C10. At a time T4, the selection signal S2_N changes from High to Low. In response, the transistor M13 turns from ON to OFF to end the data write to the N-th pixel circuit row. The period from the time T3 to the time T4 is a period to write data to the N-th pixel circuit row and has a length of 1 H. The selection signal S2_N is maintained to be High after the time T4.

At the time T4, the emission control signal Em_N changes from High to Low. In response, the transistor M15 turns from OFF to ON. As a result, the driving current is supplied to the OLED element E1 and the OLED element E1 starts emitting light.

Figure 4:
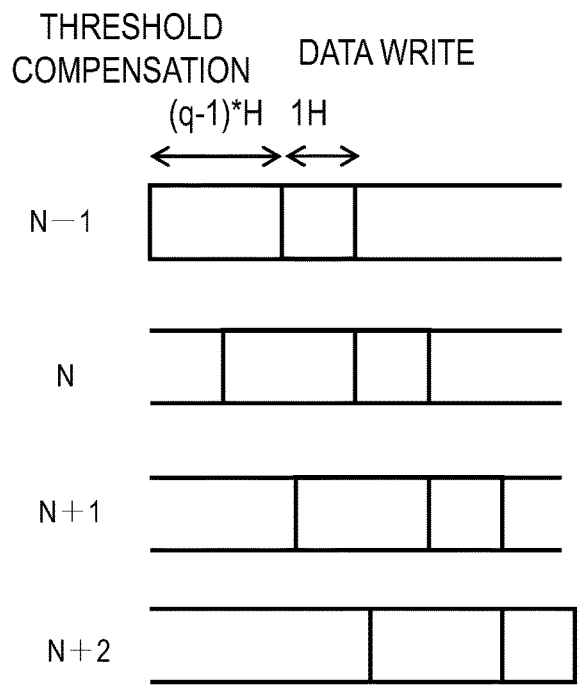
FIG. 4 schematically illustrates a relation among threshold compensation periods and data write periods in four consecutive pixel circuit rows.

FIG. 4 schematically illustrates a relation among threshold compensation periods and data write periods in four consecutive pixel circuit rows. In each pixel circuit row, a data write period follows a threshold compensation period. The lengths of the data write periods and the threshold compensation periods are common to the pixel circuit rows. The length of a data write period is 1 H and the length of a threshold compensation period is (q−1)*H, where q is an integer greater than 1. For more appropriate threshold compensation, the value of q is determined to be an integer greater than 2. In the example described with reference to FIG. 3, the value of q is 6.

As will be described later, a threshold compensation period can have different lengths depending on the selection signal S2_N−q for a previous row to cause a change of the selection signal S1_N. As described above, the length of the period in which the selection signal S1_N is Low is qH and the length of the threshold compensation period is (q−1)*H. In designing a display device, the value of q is selected to attain an appropriate threshold compensation period.

As illustrated in FIG. 4, data signals are serially written to the pixel circuit rows. The data write period for each pixel circuit row starts immediately after the data write period for the previous row has ended. The data write periods for different pixel circuit rows never overlap. The threshold compensation period for each pixel circuit row overlaps the threshold compensation period and the data write period for the previous pixel circuit row. A threshold compensation period can overlap data write periods for the previous and some preceding pixel circuit rows.

Combination of Shift Register Circuit and Latch Circuit Set

Figures 5, 6:
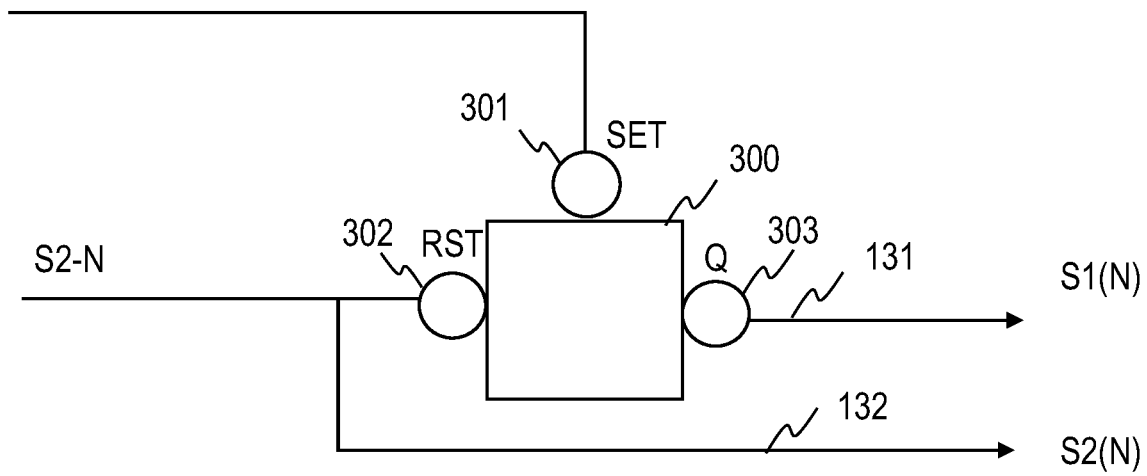
FIG. 5 illustrates a configuration example of a latch circuit included in a latch circuit set.
FIG. 6 provides a truth table for the latch circuit.

FIG. 5 illustrates a configuration example of a latch circuit 300 included in the latch circuit set 113. The latch circuit 300 in FIG. 5 outputs a selection signal S1_N to the N-th pixel circuit row. The latch circuit 300 includes a SET terminal 301 and a RST terminal 302 for receiving a signal and a Q terminal 303 for outputting a signal.

The selection signal S2_N−6 for the (N−6)th pixel circuit row is input from the shift register circuit 111 to the SET terminal 301. The selection signal S2_N for the N-th pixel circuit row is input to the RST terminal 302. The latch circuit 300 outputs an S1_N signal from the Q terminal 303 to the S1 signal line 131 for the N-th pixel circuit row.

FIG. 6 provides a truth table for the latch circuit 300. In the truth table of FIG. 6, L represents a logical Low level and H represents a logical High level. In the configuration described with reference to FIGS. 3 to 5, the High potential levels of the signals S1 and S2 correspond to the logical Low and the Low potential levels of those signals correspond to the logical High.

When a SET input is L and an RST input is L, the Q output is L. When a SET input is H and an RST input is L, the Q output is H and the Q output is maintained to be H even if the SET input changes afterwards. When a SET input is L and an RST input is H, the Q output is L. The state where both a SET input and an RST input are H is not allowed.

As understood from the description with reference to FIGS. 3 and 5, the shift register circuit 111 outputs pulses of the selection signal S2 serially to the pixel circuit rows. The pulse width is 1 H. Each latch circuit 300 outputs an S1 signal to the associated pixel circuit row.

As described above, when the latch circuit 300 for the N-th row receives a pulse of a Low potential level (logical level H) of the selection signal S2_N−q for the row preceding by a predetermined number of rows at the SET terminal 301, it alters the selection signal S1_N to be output from the Q terminal 303 into a Low potential level. Although the selection signal S2_N−q subsequently changes to a High potential level (logical level L), the input S2_N to the RST terminal 302 is at a High potential level and therefore, the selection signal S1_N to be output from the Q terminal 303 is maintained to be the Low potential level.

Subsequently, the latch circuit 300 receives a pulse at a Low potential level (logical level H) of the selection signal S2_N for the N-th pixel circuit row at the RST terminal 302. In response, the latch circuit 300 alters the selection signal S1_N to be output from the Q terminal 303 to a High potential level (logical level L). The pulse width of the S1_N signal output from the latch circuit 300 is qH.

Figure 7:
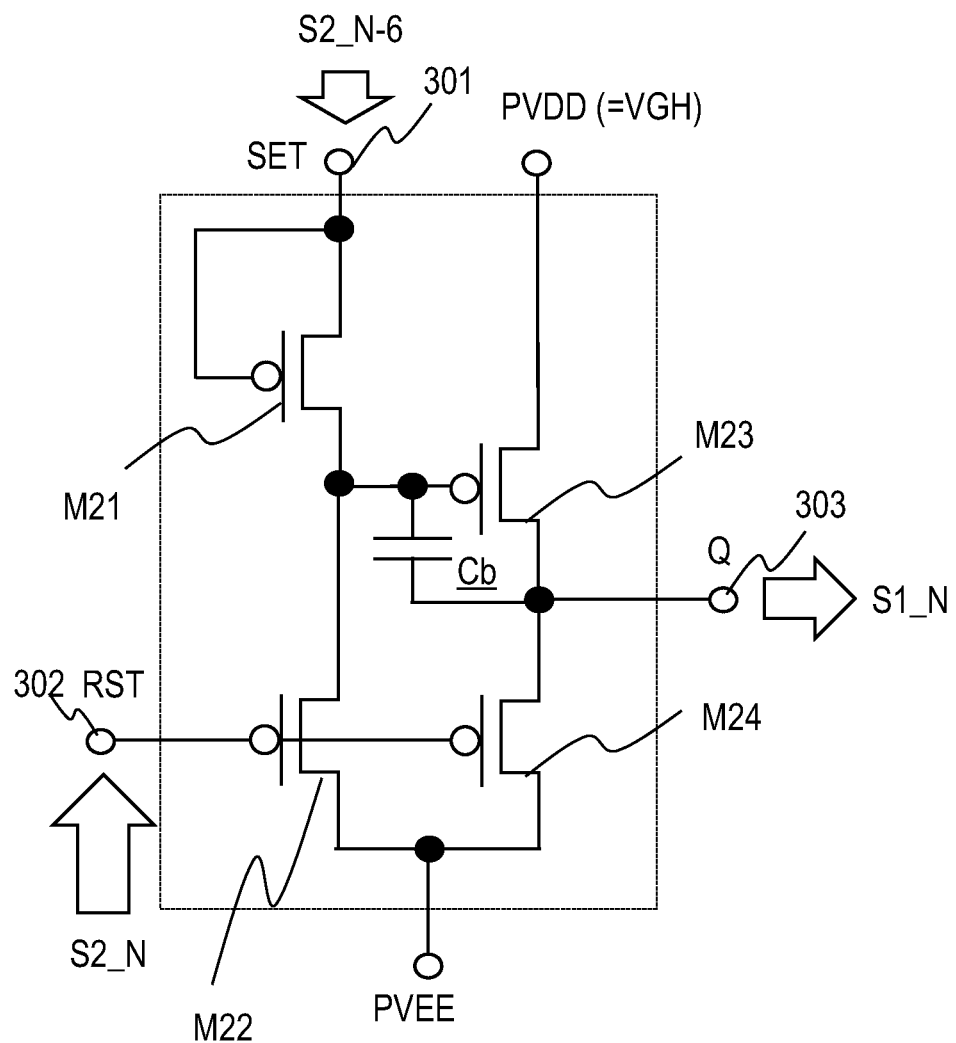
FIG. 7 illustrates an example of the circuit configuration of the latch circuit.

FIG. 7 illustrates an example of the circuit configuration of the latch circuit 300. In the configuration example of FIG. 7, the latch circuit 300 includes four transistors and one capacitive element. The four transistors M21 to M24 are p-type transistors. The transistor M21 is diode-connected and receives an input from the SET terminal 301 at the drain. The transistor M22 is connected between the transistor M21 and the power supply for supplying the power supply potential PVEE and receives an input from the RST terminal 302 at the gate.

The transistor M23 is connected between the power supply for supplying the power supply potential PVDD and the Q terminal 303 and its gate is connected with an intermediate node between the transistors M21 and M22. The transistor M24 is connected between the transistor M23 and the power supply for supplying the power supply potential PVEE and receives an input from the RST terminal at the gate. The capacitive element Cb is connected between the gate of the transistor M23 and the Q terminal 303. An intermediate node between the transistors M23 and M24 is connected with the Q terminal 303.

Figure 8:
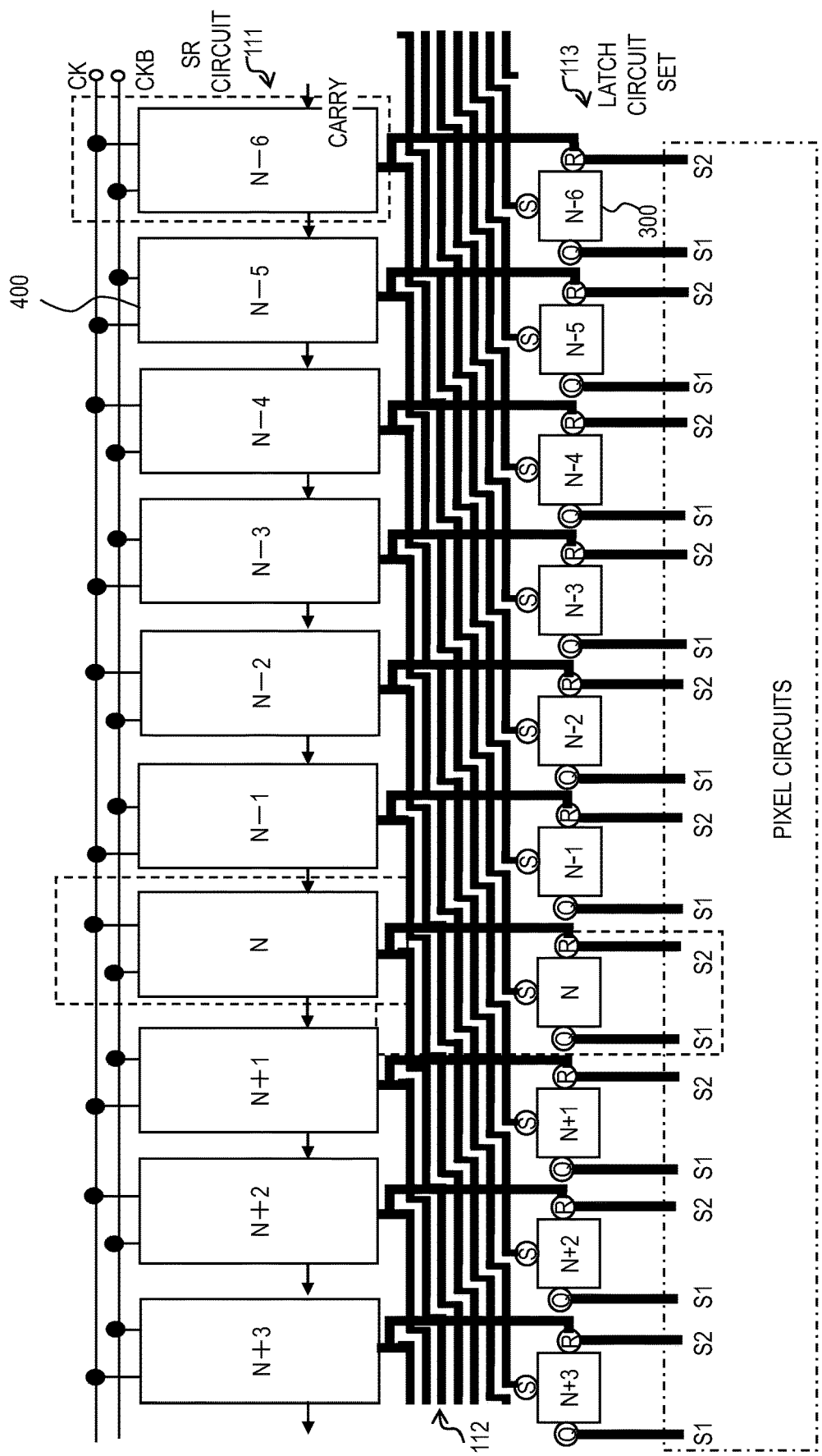
FIG. 8 schematically illustrates a configuration example of a shift register circuit and a latch circuit set and an example of the layout of lines.

FIG. 8 schematically illustrates a configuration example of the shift register circuit 111 and the latch circuit set 113 and an example of the layout of lines 112. The shift register circuit 111 includes a plurality of shift register units connected in series. In FIG. 8, only one of the shift register units is provided with a reference sign 400.

FIG. 8 includes the (N−6)th to (N+3)th shift register units 400. These shift register units 400 are associated with the (N−6)th to (N+3)th pixel circuit rows. A data bit is transferred from a shift register unit 400 to the next shift register unit 400 in accordance with two clock signals CK and CKB. The shift register unit 400 holding the data bit outputs a signal pulse.

The latch circuit set 113 includes a plurality of latch circuits 300. In FIG. 8, only one of the latch circuits is provided with a reference sign 300. FIG. 8 includes the (N−6)th to (N+3)th latch circuits 300. These latch circuits 300 are associated with the (N−6)th to (N+3)th pixel circuit rows.

The shift register circuit 111 includes shift register units 400 each associated with a pixel circuit row. A shift register unit 400 associated with a pixel circuit row outputs a signal pulse to the associated pixel circuit row and two latch circuits 300. The number of shift register units 400 are larger than the number of pixel circuit rows. Some shift register units 400 (not shown) are not connected with a pixel circuit row and output a signal only to latch circuits 300.

The two inputs of a latch circuit 300 are connected with the outputs of two different shift register units 400. Specifically, the output of the shift register unit 400 of the earlier stage is input to the SET terminal, denoted as S, and the output from the shift register unit 400 of the later stage is input to the RST terminal, denoted as R. In the configuration example of FIG. 8, the output of the (N−6)th shift register unit 400 is input to the SET terminal of the N-th latch circuit 300 and the output of the N-th shift register unit 400 is input to the RST terminal of the N-th latch circuit 300.

The N-th shift register unit 400 outputs a selection signal S2 for the N-th pixel circuit row to the N-th pixel circuit row, the RST terminal of the N-th latch circuit 300, and the SET terminal of the (N+6)th latch circuit 300. The N-th shift register unit 400 outputs a signal pulse to these simultaneously.

The N-th latch circuit 300 outputs a selection signal S1 from the Q terminal, denoted as Q, to the N-th pixel circuit row. As described above, the N-th latch circuit 300 starts a pulse of the selection signal S1 in response to a signal pulse from the (N−6)th shift register unit 400 and ends the pulse in response to a signal pulse from the N-th shift register unit 400. The pulse from the latch circuit 300 is a pulse of a first kind of signal and the pulse from the shift register unit 400 is a pulse of a second kind of signal. The selection signal S1_N is generated using two shift register units and one latch circuit as described above.

The foregoing description about the N-th shift register unit 400 and the N-th latch circuit 300 applies to the other stages of shift register units 400 and latch circuits 300 associated with individual pixel circuit rows. Although the foregoing example controls a latch circuit 300 with outputs from two shift register units 400 six stages apart; the relation of the stages of the shift register units 400 for controlling a latch circuit 300 are determined depending on the pulse width of the selection signal S1.

More generally, the output of the N-th latch circuit is set by a signal pulse from the K-th shift register unit and is reset by a signal pulse from the (K+p)th shift register unit, where K is an integer and p is an integer greater than 1. In the foregoing example, K is (N−6) and p is 6.

The output of the (N+q)th latch circuit is set by a signal pulse from the (K+q)th shift register unit and is reset by a signal pulse from the (K+q+p)th shift register unit, where q is an integer greater than 0. The pulse from the latch circuit 300 has a pulse width of p*H. The pulse from the (N+q)th latch circuit is delayed from the pulse from the N-th latch circuit by a time of q*H. As described above, the threshold compensation period has a length of (p−1)*H.

Figure 9:
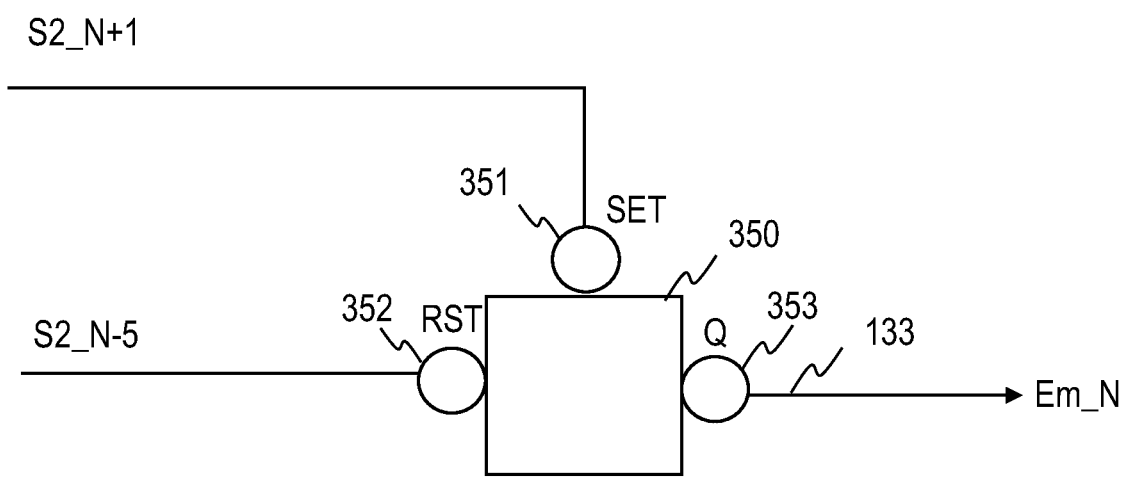
FIG. 9 illustrates input and output signals of the N-th latch circuit included in a latch circuit set.

Next, a configuration for generating an emission control signal Em with a combination of a shift register circuit and a latch circuit set is described. FIG. 9 illustrates input and output signals of the N-th latch circuit 350 included in a latch circuit set. The truth table of the latch circuit 350 is the same as the one described with reference to FIG. 6.

A selection signal S2_N−5 is input from the (N−5)th shift register unit to the RST terminal 352 of the latch circuit 350. A selection signal S2_N+1 is input from the (N+1)th shift register unit to the SET terminal 351 of the latch circuit 350. The latch circuit 350 outputs an emission control signal Em_N from the Q terminal 353 to the N-th pixel circuit row. In the case where the threshold compensation period has a length of (p−1)*H, the latch circuit 350 receives a selection signal S2 from the (N−(p−1))th shift register at the RST terminal 352.

Figure 10A:
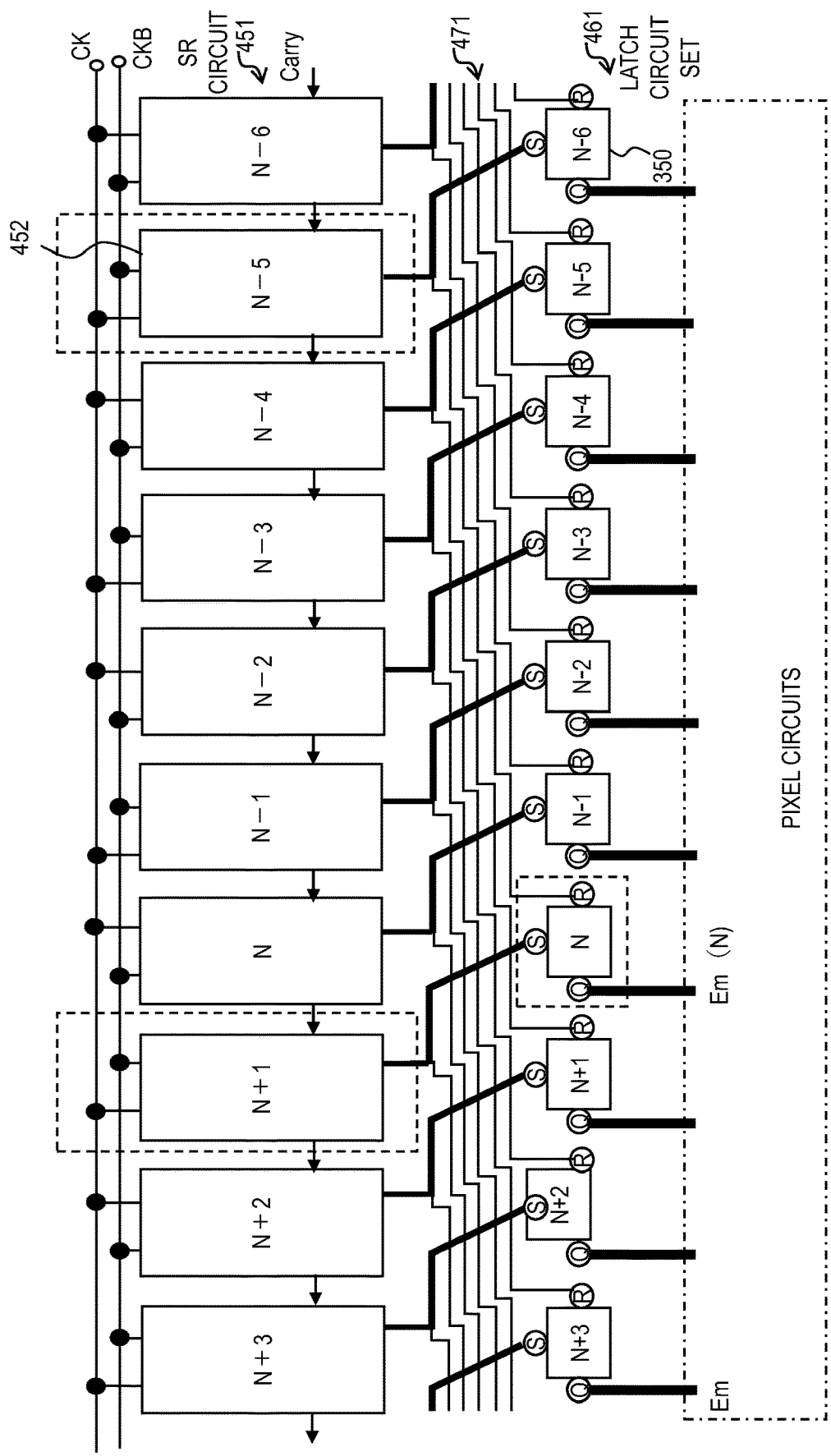
FIG. 10A schematically illustrates a configuration example of a shift register circuit and a latch circuit set and an example of the layout of lines for generating an emission control signal Em.

FIG. 10A schematically illustrates a configuration example of a shift register circuit and a latch circuit set and an example of the layout of lines for generating an emission control signal Em. This configuration enables designing a circuit for generating an emission control signal Em more easily.

The shift register circuit 451 includes a plurality of shift register units 452 connected in series. Only one of the shift register units is provided with a reference sign 452. Each shift register unit 452 has the same configuration as a shift register unit 400. The shift register circuit 451 does not output a signal directly to the pixel circuits but outputs a signal only to the latch circuit set 461.

Figure 10B:
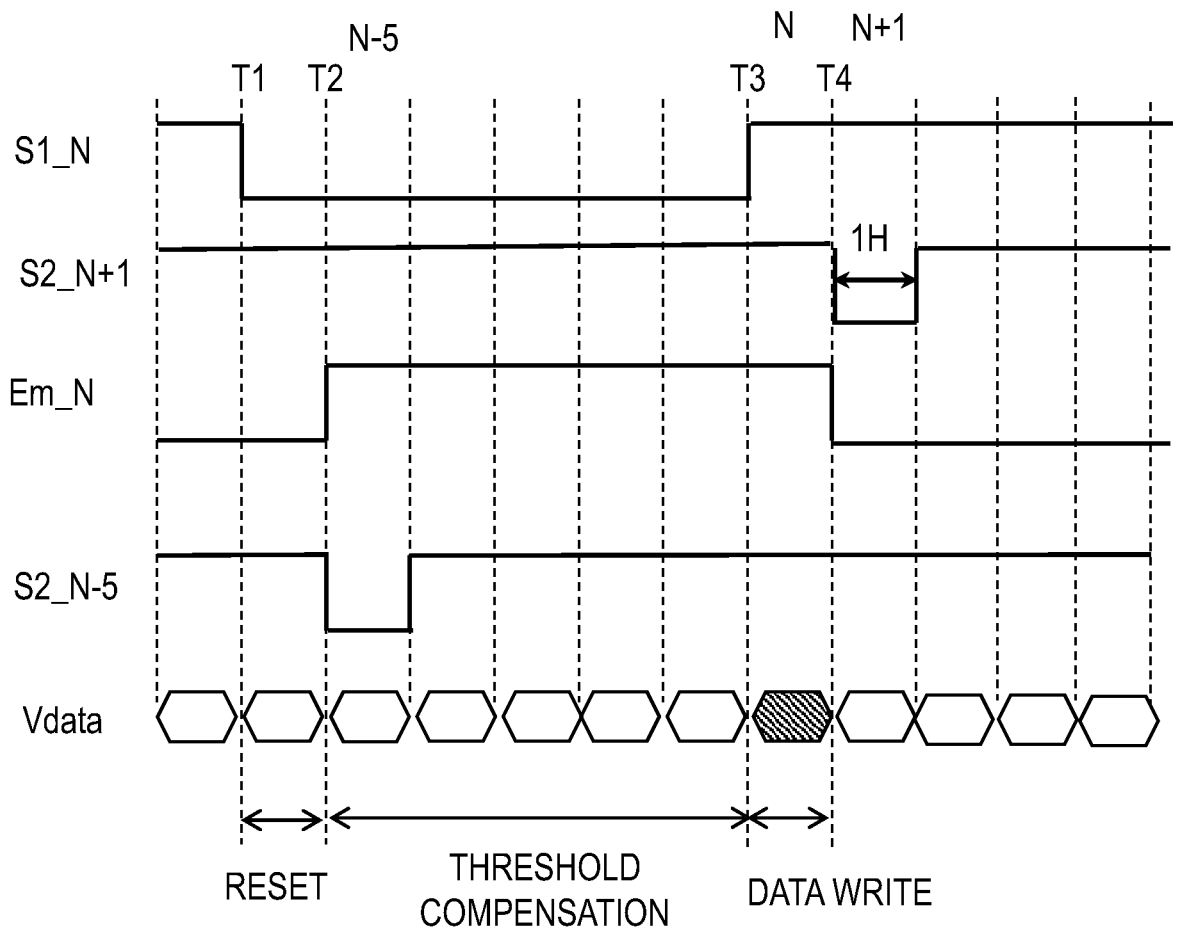
FIG. 10B is a timing chart of an output signal Em from the latch circuits in FIG. 10A.

The latch circuit set 461 includes a plurality of latch circuits 350 each associated with a pixel circuit row. One of the latch circuits is provided with a reference sign 350. The latch circuit set 461 has the same configuration as the latch circuit set described with reference to FIG. 8. Compared to the configuration of FIG. 8, the configuration of FIG. 10 is different in connection lines 471 between the shift register circuit 451 and the latch circuit set 461.

FIG. 10A includes the (N−6)th to (N+3)th shift register units 452 and latch circuits 350. The latch circuits 350 are associated with the (N−6)th to (N+3)th pixel circuit rows. The number of shift register units 452 is larger than the number of pixel circuit rows.

The two inputs of a latch circuit 350 are connected with the outputs of two different shift register units 452. Specifically, the output of the shift register unit 452 of the earlier stage is input to the RST terminal and the output from the shift register unit 452 of the later stage is input to the SET terminal. In the configuration example of FIG. 10A, the output of the (N−5)th shift register unit 452 is input to the RST terminal of the N-th latch circuit 350 and the output of the (N+1)th shift register unit 452 is input to the SET terminal of the N-th latch circuit 350.

The N-th shift register unit 452 outputs a control signal to the SET terminal of the (N−1)th latch circuit 350 and the RST terminal of the (N+5)th latch circuit 350. The N-th shift register unit 452 outputs a signal pulse to these simultaneously.

The N-th latch circuit 350 outputs an emission control signal Em from the Q terminal to the N-th pixel circuit row. The N-th latch circuit 350 starts a pulse of the emission control signal Em in response to a signal pulse from the (N−5)th shift register unit 452 and ends the pulse in response to a signal pulse from the (N+1)th shift register unit 452.

The polarity (potential level) of the pulses of the emission control signal Em is opposite to the polarity of the pulses of the selection signal S1. The timing chart of the signals is provided in FIG. 10B. A pulse from a latch circuit 350 is a pulse of a first kind of signal and a pulse from a shift register unit 452 is a pulse of a second kind of signal.

The foregoing description about the N-th shift register unit 452 and the N-th latch circuit 350 applies to the other stages of latch circuits 350 and shift register units 452 associated with individual pixel circuit rows. Although the foregoing example controls a latch circuit 350 with outputs from two shift register units 452 six stages apart, the relation of the stages of the shift register units 452 for controlling a latch circuit 350 can be determined depending on the pulse width of the emission control signal Em.

More generally, the output of the N-th latch circuit is reset by a signal pulse from the K-th shift register unit and is set by a signal pulse from the (K+p)th shift register unit. In the foregoing example, K is (N−5) and p is 6.

The output of the (N+q)th latch circuit is reset by a signal pulse from the (K+q)th shift register unit and is set by a signal pulse by the (K+q+p)th shift register unit. The pulse from the latch circuit has a pulse width of p*H. The pulse from the (N+q)th latch circuit is delayed from the pulse from the N-th latch circuit by a time of q*H. As described above, the period in which the supply of electric current to the OLED element E1 is OFF has a length of p*H.

The configuration example described with reference to FIG. 10A generates and outputs only the emission control signal Em without generating the selection signal S2, using a combination of a shift register circuit and a latch circuit set. Another configuration example may generate and output the selection signal S2 in addition to the emission control signal Em. In this case, the OLED display device includes a shift register circuit for generating the selection signal S1 and outputting it without sending it to a latch circuit set.

A circuit for generating the selection signal S2 and the emission control signal Em is attained by adding control signal lines from the outputs of the shift register units 452 to the associated pixel circuit rows to the configuration example of FIG. 10A. A shift register unit 452 connected with a pixel circuit row outputs a signal pulse to the associated pixel circuit row as well as the two latch circuits described with reference to FIG. 10A. The driving method of this disclosure is not limited to the foregoing two embodiments but is a versatile method to generate pulses having a desirable width by changing the time sequence of the SET signal and the RST signal input to the latch circuit and the interval between the SET signal and the RST signal.

Figure 11:
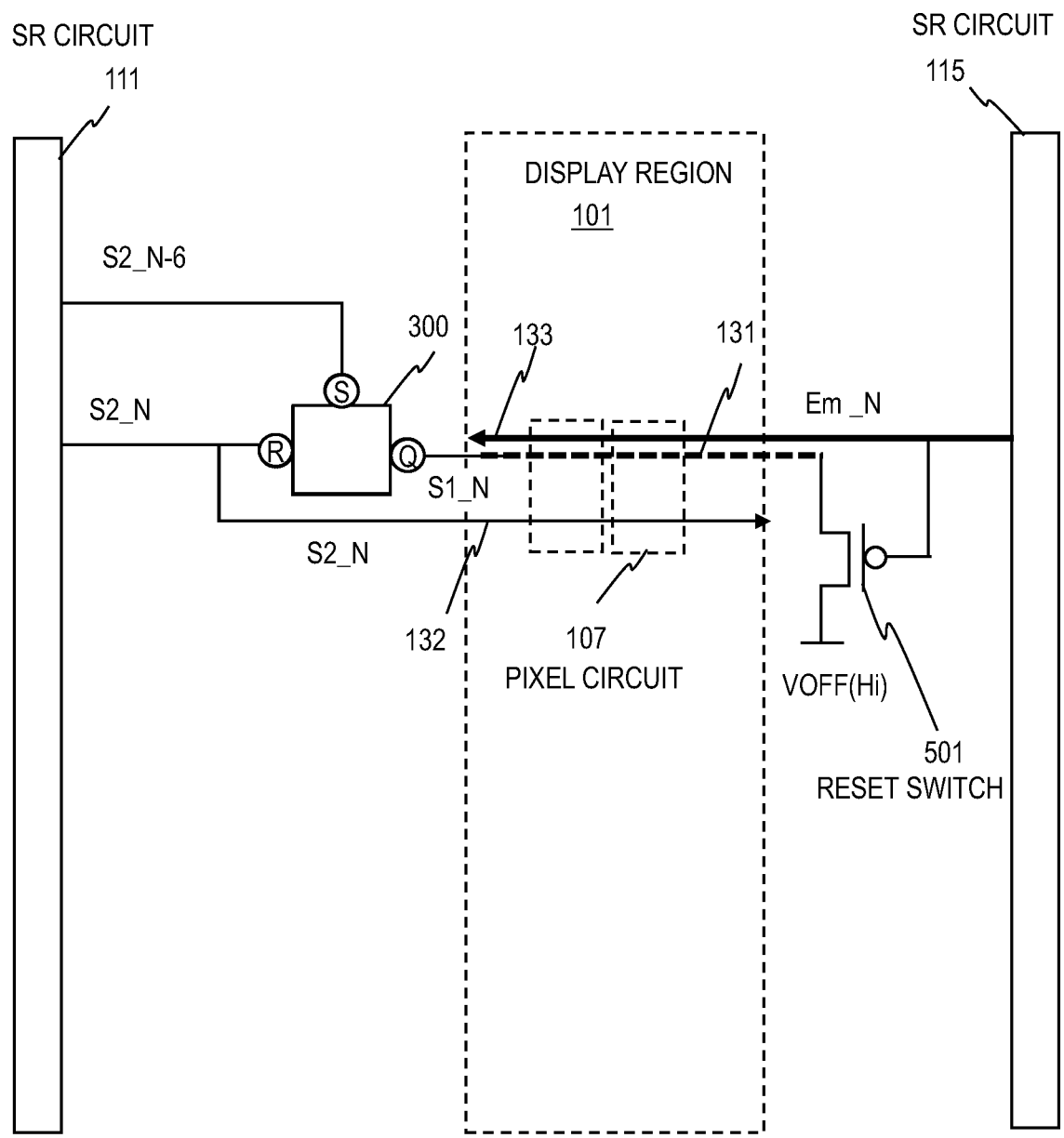
FIG. 11 illustrates a configuration example where a signal line for transmitting a selection signal S1 from a latch circuit is connected to a power supply potential VOFF.

FIG. 11 illustrates a configuration example where a signal line 131 for transmitting the selection signal S1 from a latch circuit 300 is connected to a power supply potential VOFF. This configuration prevents the S1 signal line from becoming a floating state during an emission period.

Since the transistors M23 and M24 connected with the S1 signal line are OFF during an emission period, the S1 signal line becomes an electrically floating state. The potential of the S1 signal line is held by the capacitance across the whole signal line but it varies because of the feedthrough noise via the capacitance coupled with the capacitance of the data lines crossing the S1 signal line in the display region. When this potential variation is large, the image quality could be degraded. Accordingly, it is more appropriate to fix the potential of the S1 signal line during the emission period.

The configuration example of FIG. 11 includes a reset switch (switch transistor) 501 for turning ON/OFF the connection between the S1 signal line 131 and the power line of the power supply potential VOFF. The reset switch 501 in the configuration example of FIG. 11 is a p-type TFT. Each S1 signal line 131 is provided with a reset switch 501. The power supply potential VOFF is a potential opposite from the pulse potential of the selection signal S1 and is at a High potential level in the configuration examples described with reference to FIGS. 2 to 10.

The reset switch 501 is turned ON/OFF by the emission control signal Em output from the shift register circuit 115. The emission control signal Em is a signal for controlling whether to supply the driving current to the OLED element E1. Specifically, the reset switch 501 to turn ON/OFF the supply of the power supply potential VOFF to the S1 signal line 131 for the N-th pixel circuit row is turned ON/OFF by the emission control signal Em_N for the same N-th pixel circuit row.

Figure 12:
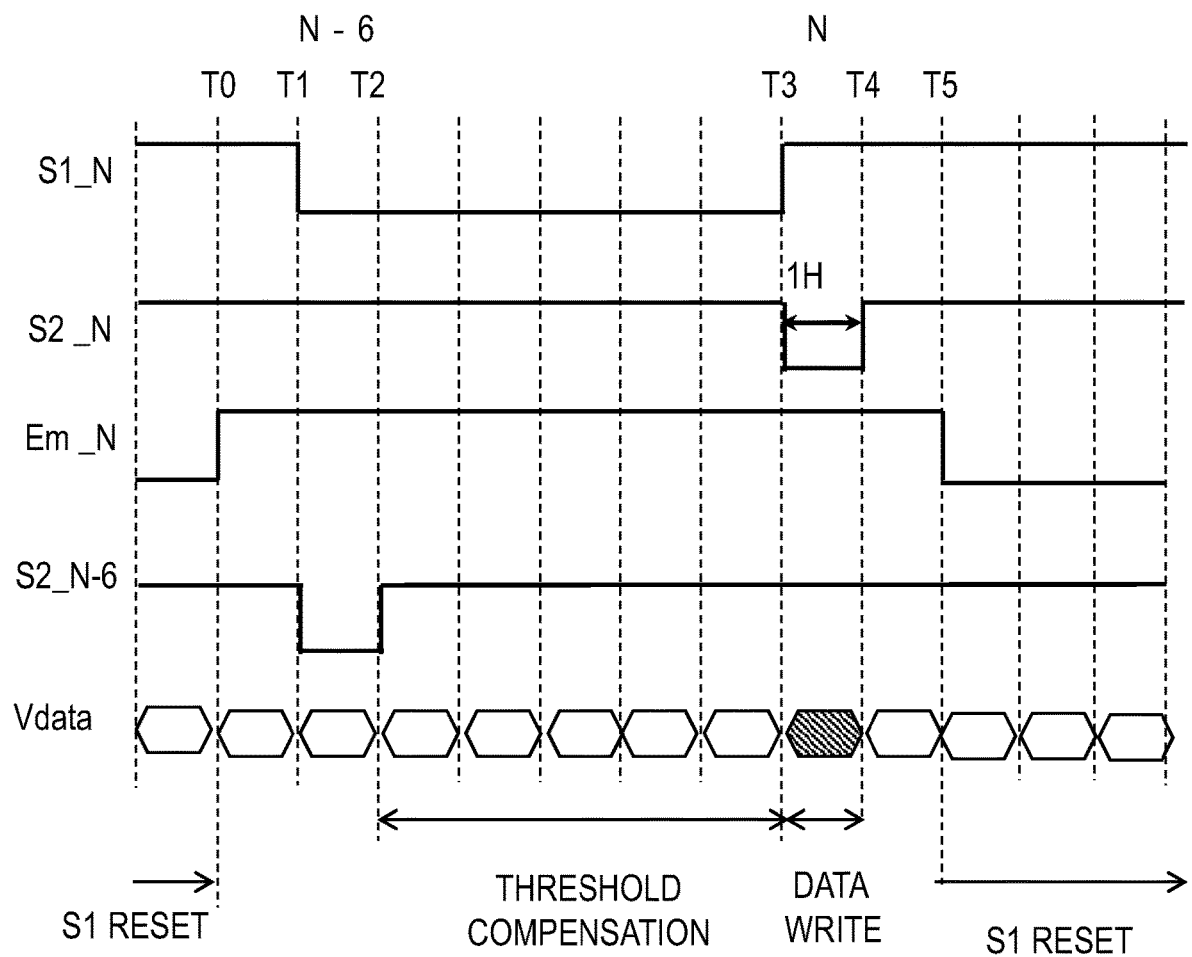
FIG. 12 is a timing chart of the control signals in the circuit illustrated in FIG. 11.

FIG. 12 is a timing chart of the control signals in the circuit illustrated in FIG. 11. The following mainly describes differences from the timing chart of FIG. 3. The emission control signal Em_N changes from Low to High at a time T0 earlier than the time T1 by 1 H. When the emission control signal Em_N is Low, the reset switch 501 is ON and the N-th S1 signal line 131 is fixed at the power supply potential VOFF.

The reset switch 501 turns OFF in response to the change of the emission control signal Em_N to High. The S1 signal line 131 becomes a floating state. At the time T1, the latch circuit 300 starts outputting a low-level signal to the selection signal S1_N. The emission control signal Em_N is High and the transistor M15 is OFF. The reset potential Vrst is supplied to the anode of the OLED element E1 but not to the gate of the driving transistor M11.

At a time T5 later than the time T4 by 1 H, the emission control signal Em_N changes from High to Low. The reset switch 501 turns ON in response to the change of the emission control signal Em_N to Low. The N-th S1 signal line 131 is fixed to the power supply potential VOFF.

Figure 13:
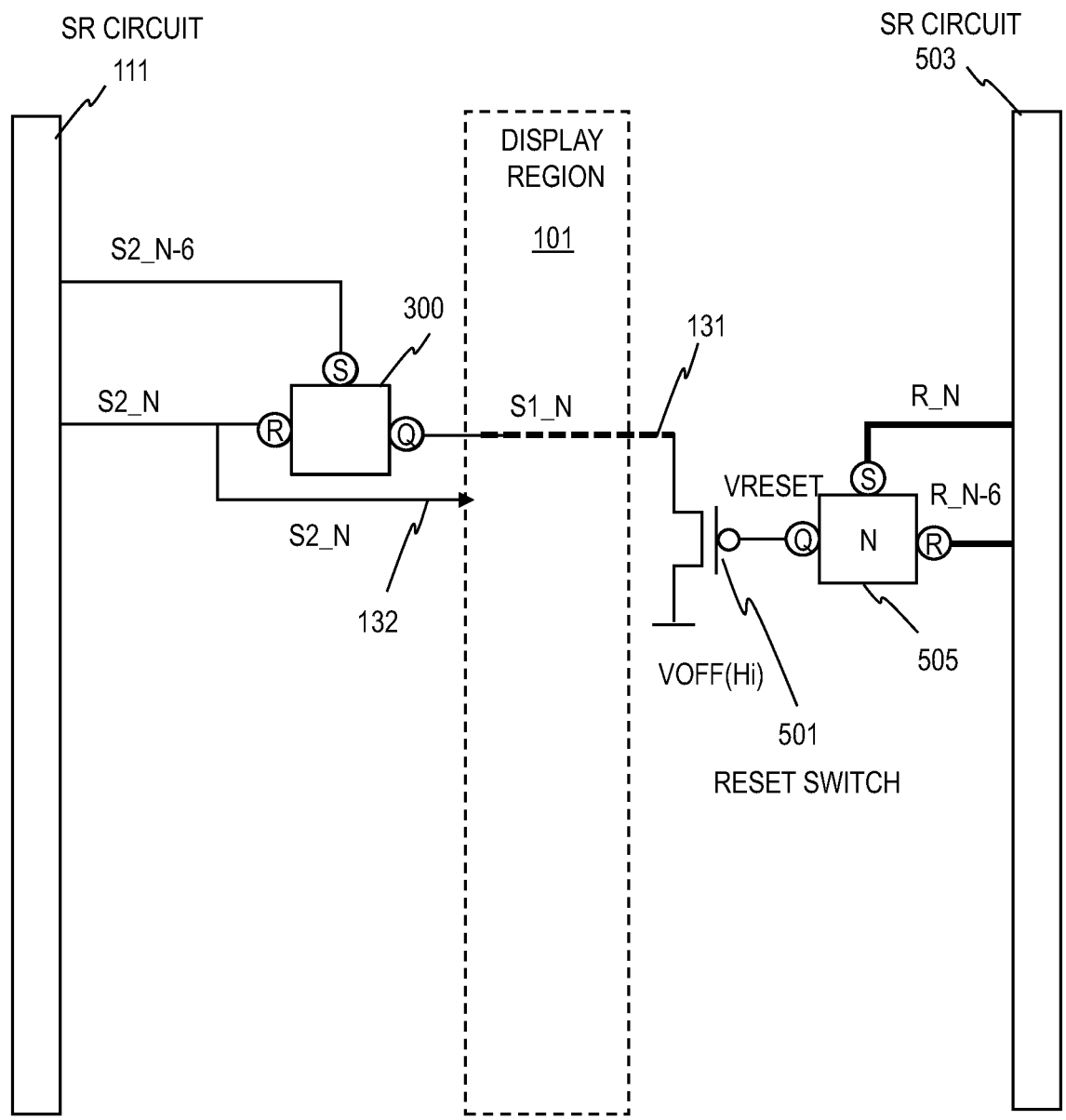
FIG. 13 illustrates another configuration example for supplying the power supply potential VOFF to the S1 signal line.

FIG. 13 illustrates another configuration example for supplying the power supply potential VOFF to the S1 signal line. The configuration example of FIG. 13 generates and outputs a signal VRESET for controlling a reset switch 501 with a combination of a shift register circuit 503 and a latch circuit set. Although FIG. 13 illustrates the N-th latch circuit 505 by way of example, the latch circuit set includes latch circuits 505 associated with all S1 signal lines in one-to-one correspondence. The output of the latch circuit 505 is input to the gate of the reset switch 501 associated with the same S1 signal line. The pulses from the shift register units have a period of 1 H.

The N-th latch circuit 505 in the configuration example of FIG. 13 receives the output of the (N−6)th shift register unit at the RST terminal and the output of the N-th shift register unit at the SET terminal. The N-th latch circuit 505 outputs a control signal VRESET from the Q terminal to the gate of the N-th reset switch 501.

Figure 14:
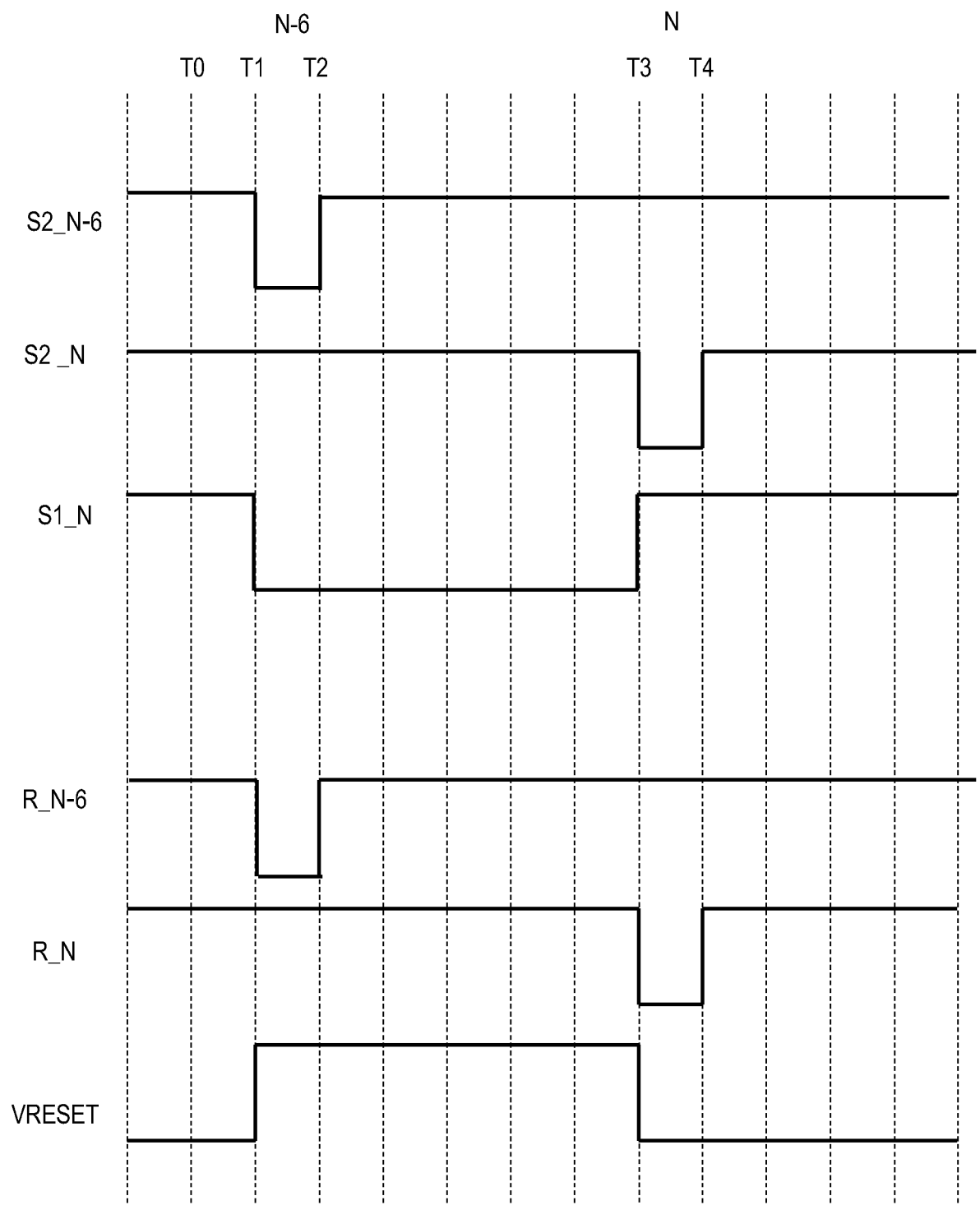
FIG. 14 is a timing chart of the control signals in the configuration example in FIG. 13.

FIG. 14 is a timing chart of the control signals in the configuration example of FIG. 13. The following mainly describes differences from the timing chart of FIG. 3. As noted from FIG. 14, the control signal VRESET for the N-th reset switch 501 changes complementarily with the selection signal S1 for the N-th pixel circuit row. In other words, one signal is High or Low, the other signal is Low or High. This configuration stabilizes the potential of the S1 signal line.

At a time T1, the output from the latch circuit 505 changes from a logical H to a logical L in response to a pulse of the control signal R_N−6 to the RST terminal. In other words, the output VRESET from the latch circuit 505 changes from a Low potential level to a High potential level, which turns OFF the reset switch 501.

At a subsequent time T3, the output from the latch circuit 505 changes from the logical L to a logical H in response to a pulse of the control signal R_N to the SET terminal. In other words, the output VRESET from the latch circuit 505 changes from the High potential level to a Low potential level, which turns ON the reset switch 501 to supply the power supply potential VOFF to the S1 signal line.

As described with reference to FIGS. 11 to 14, each line for transmitting a pulse from a latch circuit to a pixel circuit row is connected to a power line at a high-level potential after the end of the pulse. This configuration stabilizes the potential of the line. The potential level to be supplied to the line is the reference potential level of the pulse and can be a Low level depending on the waveform of the S1 signal.

The configuration example described with reference to FIGS. 13 and 14 includes a second shift register circuit 503 and a plurality of second latch circuits 505. Each latch circuit 505 outputs a signal pulse to the reset switch 501 associated therewith.

The shift register circuit 503 serially outputs signal pulses. Each latch circuit 505 receives a signal pulse from a shift register unit in the shift register circuit 503 and a signal pulse from another shift register unit of a later stage than the first shift register unit. The signal pulse from the latch circuit 505 starts in response to the signal pulse from the shift register unit of the earlier stage and ends in response to the signal pulse from the shift register unit of the later stage.

Each latch circuit 505 controls the associated reset switch 501 with a signal pulse synchronized with an S1 signal pulse to connect the line for transmitting the S1 signal pulse to the pixel circuit row to a power line at a high-level potential after the S1 signal pulse ends.

Another Configuration of Pixel Circuit

Figure 15:
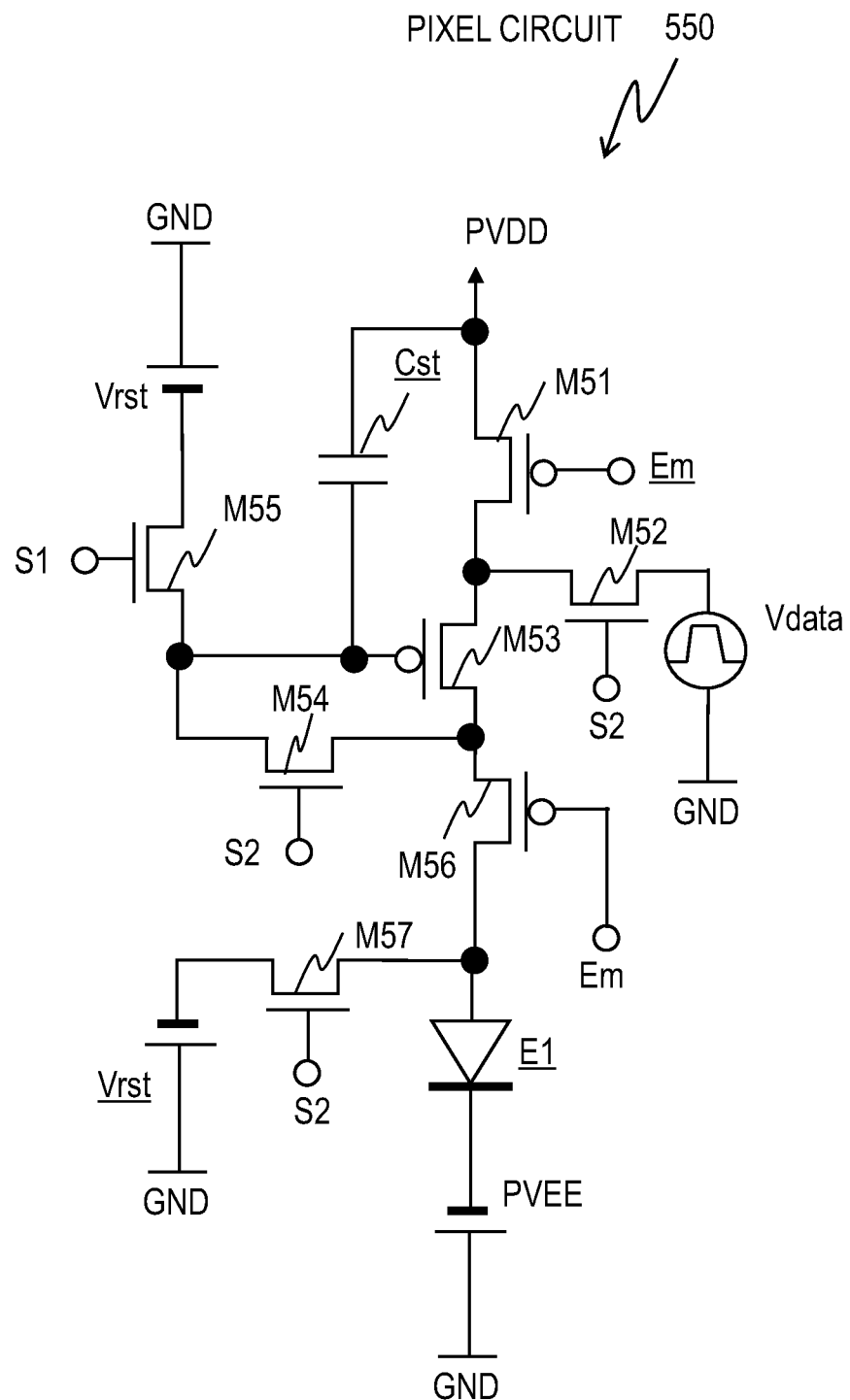
FIG. 15 illustrates another configuration example of a pixel circuit.

FIG. 15 illustrates another configuration example of a pixel circuit. A pixel circuit 550 includes p-type TFTs and n-type TFTs. The p-type TFTs can be low-temperature polysilicon TFTs and the n-type TFTs can be oxide semiconductor TFTs. The pixel circuit 550 includes seven transistors (TFTs) M51 to M57. In this example, the transistors M51, M53, and M56 are p-type TFTs and the transistors M52, M54, M55, and M57 are n-type TFTs.

The transistor M53 is a driving transistor for controlling the amount of electric current to the OLED element E1. The driving transistor M53 controls the amount of current to be supplied from the anode power supply to the OLED element E1 in accordance with the voltage stored in the storage capacitor Cst. The cathode of the OLED element E1 is connected with a cathode power supply. The storage capacitor Cst stores the gate-source voltage of the driving transistor M53.

The transistors M51 and M56 emission control transistors for controlling whether the OLED element E1 emits light. The transistor M51 is connected with the anode power supply from its source terminal and switch ON/OFF the current supply to the driving transistor M53 connected with its drain terminal. The transistor M56 is connected with the drain terminal of the driving transistor M53 from its source terminal and switch ON/OFF the current supply to the OLED element E1 connected with its drain terminal. The transistors M51 and M56 are controlled by an emission control signal Em.

The transistor M57 works to supply a reset potential to the anode of the OLED element E1. When the transistor M57 is turned ON by a selection signal S2 input to its gate, the transistor M57 supplies a reset potential Vrst from the reset power supply to the anode of the OLED element E1. The other end of the reset power supply is connected with the GND.

The transistor M55 controls whether to supply the reset potential to the gate of the driving transistor M53. When the transistor M55 is turned ON by a selection signal S1 input to its gate, the transistor M55 supplies the reset potential Vrst from the reset power supply connected with its source/drain to the gate of the driving transistor M53. The other end of the reset power supply is connected with the GND. The reset potential for the anode of the OLED element E1 and the reset potential for the gate of the driving transistor M53 can be different.

The transistor M52 is a selection transistor for selecting a pixel circuit 550 to be supplied with a data signal. The gate voltage of the transistor M52 is controlled by the selection signal S2. The selection transistor M52 supplies a data signal Vdata supplied from the driver IC 117 through a data line to the gate of the driving transistor M53 (storage capacitor Cst) when it is ON.

In this example, the selection transistor M52 is connected between the data line and the source of the driving transistor M53. Further, the transistor M54 is connected between the drain and the gate of the driving transistor M53.

The transistor M54 works to correct the threshold voltage of the driving transistor M53. When the transistor M54 is ON, the driving transistor M53 becomes a diode-connected state. The data signal Vdata from the data line is supplied to the storage capacitor Cst through the channels (sources and drains) of the selection transistor M52, the driving transistor M53, and the transistor M54 that are ON.

The storage capacitor Cst works to hold the gate-source voltage of the driving transistor M53; its one end is connected with the gate of the driving transistor M53 and the other end is connected with a node between the source of the transistor M51 and the anode power supply. The storage capacitor Cst holds a data signal (voltage) adjusted depending on the threshold voltage Vth of the driving transistor M53.

Figure 16:
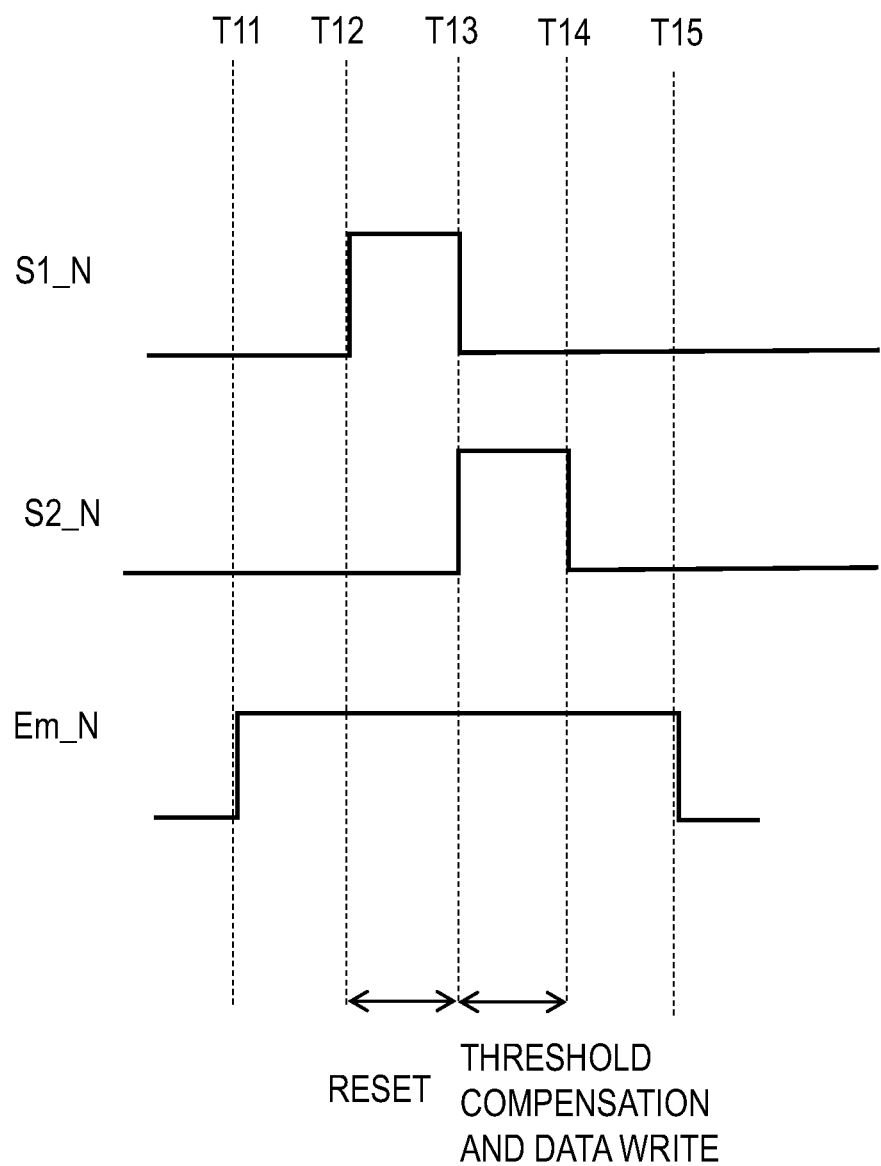
FIG. 16 is a timing chart of the signals for controlling the pixel circuit illustrated in FIG. 15 in one frame period.

FIG. 16 is a timing chart of the signals for controlling the pixel circuit 550 illustrated in FIG. 15 in one frame period. FIG. 16 is a timing chart to select the N-th pixel circuit row and write a data signal Vdata to a pixel circuit 550. Specifically, FIG. 16 illustrates variation of the emission control signal Em_N, the selection signal S1_N, and the selection signal S2_N within one frame.

At a time T11, the emission control signal Em changes from Low to High. The transistors M51 and M56 are turned OFF. The selection signals S1_N and S2_N are Low at the time T11. In accordance with these control signals, the transistors M52, M54, M55, and M57 are OFF. The states of these transistors are maintained until a time T12 subsequent to the time T11.

At the time T12, the selection signal S1_N changes from Low to High. The emission control signal Em_N is High and the selection signal S2_N is Low at the time T12. The transistor M55 turns ON in response to the change of the selection signal S1_N. The transistors M51, M52, M54, M56, and M57 are OFF.

In response to the transistor M55 turning ON, the gate potential of the driving transistor M53 changes to the reset potential Vrst. The reset potential Vrst is supplied to the gate of the driving transistor M53 from the time T12 until a time T13. The driving transistor M53 can reduce the hysteresis effect by being supplied with the reset potential at its gate.

At the time T13, the selection signal S1_N changes from High to Low and the selection signal S2_N changes from Low to High. The emission control signal Em_N is High. The transistor M55 turns OFF in response to the change of the selection signal S1_N. The transistors M52, M54, and M57 turn ON in response to the change of the selection signal S2_N. The transistors M51 and M56 are OFF.

In response to the transistor M57 turning ON, the reset potential Vrst of the reset poser supply is supplied to the anode of the OLED element E1. Since the transistor M54 is ON, the driving transistor M53 is diode-connected. Since the transistor M52 is ON, the data signal Vdata from the data line is written to the storage capacitor Cst via the transistors M52, M53, and M54.

The voltage to be written to the storage capacitor Cst is a voltage after the correction to the threshold voltage Vth of the driving transistor M53 is incorporated in the data signal Vdata. In the period from the time T13 to a time T14, writing the data signal Vdata to the pixel circuit 550 and threshold compensation for the driving transistor M53 are performed.

At the time T14, the selection signal S2_N changes from High to Low. The emission control signal Em_N is High and the selection signal S1_N is Low at the time T14. The transistors M52, M54, and M57 turn OFF in response to the change of the selection signal S2_N. The transistors M51, M52, and M54 to M57 are OFF. These state of the control signals and the transistors are maintained from the time T14 to a time T15.

At the time T15, the emission control signal Em_N changes from High to Low and the transistors M51 and M56 turn from OFF to ON. The selection signals S1_N and S2_N are Low; the transistors M52, M54, M55 and M57 are still OFF.

The driving transistor M53 controls the driving current to be supplied to the OLED element E1 based on the adjusted data signal stored in the storage capacitor Cst. This means that the OLED element E1 emits light. In the timing chart of FIG. 16, each of the periods from the time T11 to the time T12, from the time T12 to the time T13, and the time T13 to the time T14 has a length of 1 H. In the configuration example illustrated in FIGS. 15 and 16, threshold compensation and data write are performed in the same period and they are not performed separately.

Figure 17:
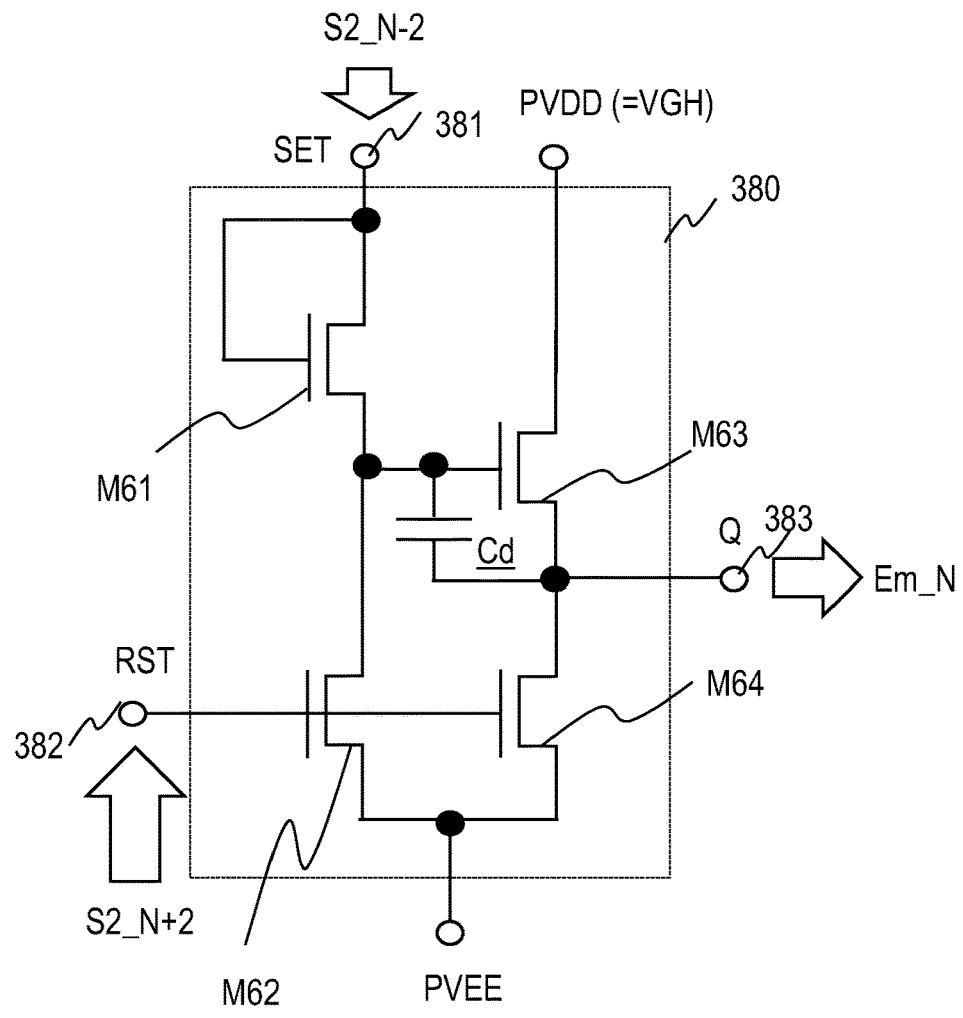
FIG. 17 illustrates a configuration example of a latch circuit in a latch circuit set to be used for the configuration example illustrated in FIGS. 15 and 16.

Hereinafter, a method of generating and outputting the control signals S1, S2, and Em with a combination of a shift register circuit and a latch circuit set in the configuration example illustrated in FIGS. 15 and 16 is described. FIG. 17 illustrates a configuration example of a latch circuit 380 to be used in the latch circuit set. Although FIG. 17 illustrates the N-th latch circuit 380, the latch circuits of the other stages have the same configuration.

The latch circuit 380 includes four transistors and one capacitive element. The four transistors M61 to M64 are n-type transistors. The transistor M61 is in a diode-connected state; it receives an input from the SET terminal 381 at its drain. The transistor M62 is connected between the transistor M61 and a power supply for supplying a power supply potential PVEE and receives an input from the RST terminal 382 at its gate.

The transistor M63 is connected between a power supply for supplying a power supply potential PVDD and the Q terminal 383 and its gate is connected with an intermediate node between the transistors M61 and M62. The transistor M64 is connected between the transistor M63 and the power supply for supplying the power supply potential PVEE and receives an RST input at its gate. The capacitive element Cd is connected between the gate of the transistor M63 and the Q terminal 383. The Q terminal 383 is connected with an intermediate node between the transistors M63 and M64.

Figure 18:
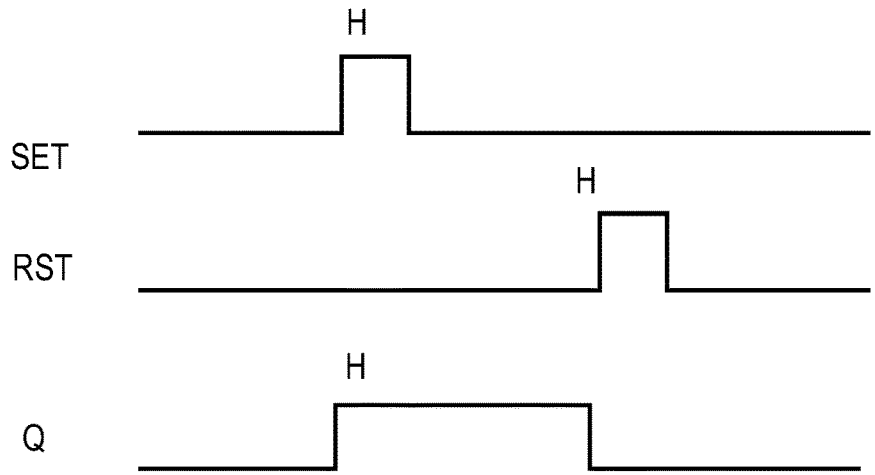
FIG. 18 is a timing chart of input signals and an output signal of the latch circuit.

FIG. 18 is a timing chart of input signals and an output signal of the latch circuit 380. In the latch circuit 380, when the logical level of a signal is H, the potential level is High. The truth table for the latch circuit 380 is the same as the one in FIG. 6.

When both the SET signal and the RST signal is at a Low potential level, the Q output is at a Low potential level. When the SET input changes to a High potential level, the Q output changes to a High potential level. The Q output maintains the High potential level even if the SET input subsequently changes to a Low potential level. Thereafter, in response to a change of the RST input to a High potential level, the Q output changes to a Low potential level. Subsequently, the RST input changes to a Low potential level and the Q output maintains the Low potential level.

Figure 19:
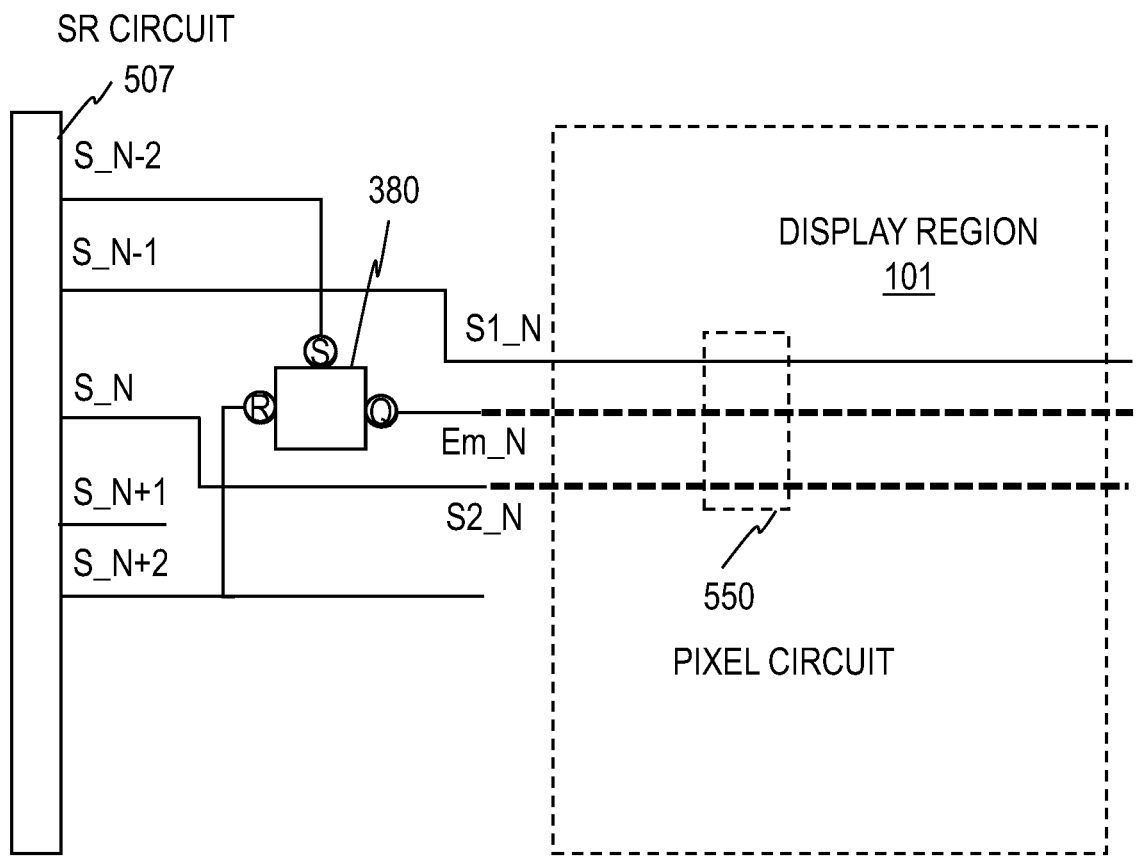
FIG. 19 schematically illustrates an example of a circuit configuration for generating and outputting control signals S1, S2, and Em with a combination of a shift register circuit and a latch circuit set.

FIG. 19 schematically illustrates an example of a circuit configuration for generating and outputting control signals S1, S2, and Em with a combination of a shift register circuit and a latch circuit set. FIG. 19 illustrates a shift register circuit 507 and one of the latch circuits 380 in the latch circuit set. The shift register circuit 507 includes a plurality of shift register units connected in series, like the shift register circuit 111. The shift register circuit 507 can have a desirable circuit configuration. In an embodiment, the transistors included in the shift register circuit 507 are all n-type TFTs.

A plurality of shift register units serially output signal pulses. The signal pulses are at a High potential level. An output S_N of the N-th shift register unit is input to the S2 signal line for the N-th pixel circuit row, the S1 signal line for the (N+1)th pixel circuit row, the RST terminal of the (N−2)th latch circuit 380, and the SET terminal of the (N+2)th latch circuit 380. The S1 signal line and the S2 signal line are first control lines.

The shift register unit outputs selection signals S1 and S2 to two pixel circuit rows and further, outputs an RST signal and a SET signal to two latch circuits 380. As understood from the above, an output pulse from a shift register unit is an S2 signal pulse for one associated pixel circuit row and an S1 signal pulse (third signal pulse) for another associated pixel circuit row.

For example, the selection signal S1_N for the N-th pixel circuit row is an output signal S_N−1 from the (N−1)th shift register unit. The selection signal S2_N for the N-th pixel circuit row is an output signal S_N from the N-th shift register unit.

As described above, the N-th latch circuit 380 receives the output signal S_N−2 from the (N−2)th shift register unit at the SET terminal and the output signal S_N+2 from the (N+2)th shift register unit at the RST terminal. The N-th latch circuit 380 outputs an emission control signal Em_N for the N-th pixel circuit row from the Q terminal. The output from the Q terminal is controlled by the signal pulses to the SET terminal and the RST terminal. The Em signal line for transmitting the emission control signal is a second control line.

As understood from the above, this configuration example generates an emission control signal Em_N for the N-th pixel circuit row from the shift register signals for the pixel circuit rows two rows before and two rows after the N-th pixel circuit row. The pulses of the emission control signal Em have a period of 4 H. The emission control signal Em in this configuration example is supplied to the gates of the p-type transistors M51 and M56 and accordingly, the emission control signal Em has a pulse having the same polarity as the selection signals S1 and S2.

A pulse having the same polarity means that the period in which the signal is at a High level is significantly shorter than the period in which the signal is at a Low level. A circuit for generating such a signal can be configured with a smaller number of TFTs to achieve a smaller circuit area by employing n-type TFTs rather than employing p-type TFTs. In an embodiment, the transistors included in the latch circuits and the shift register circuit are all n-type TFTs.

As described above, the pixel circuit 550 described with reference to FIG. 15 includes p-type (second conductive type) TFTs for the emission control transistors M56 and M51 and the driving transistor M53 and n-type (first conductive type) TFTs for the switch transistors M52, M54, M55, and M57. As described with reference to FIG. 19, the control lines (first control lines) from the shift register circuit 507 transmit the selection signal S and the control line (second control line) from the latch circuit 380 transmits the emission control signal Em. All transistors included in the shift register circuit 507 and the latch circuit 308 are n-type (first conductive type) TFTs.

As described above, this configuration example generates and outputs selection signals S1 and S2 and an emission control signal Em having a pulse width longer than 1 H with a shift register circuit and a latch circuit set including n-type TFTs. If the conductive types of the transistors in the pixel circuit 550 are changed to the opposite ones and the shift register circuit and the latch circuits include p-type TFTs, the shift register circuit and the latch circuits can be configured of one conductive type of transistors.

Device Structure of Latch Circuit

Figure 20:
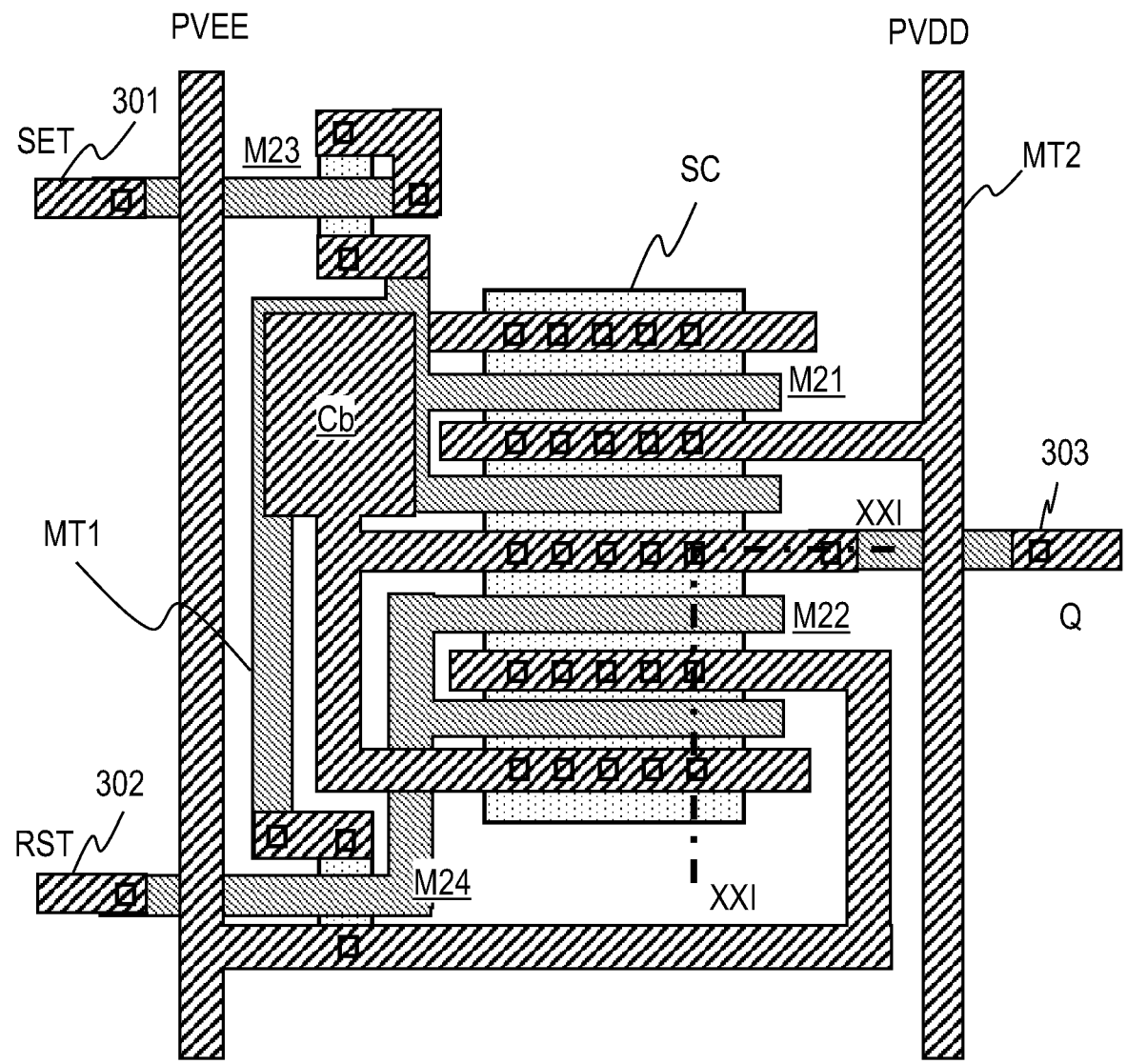
FIG. 20 is a plan diagram schematically illustrating an example of the layout of a latch circuit.

Hereinafter, an example of the device structure of a latch circuit is described. FIG. 20 is a plan diagram schematically illustrating an example of the layout of a latch circuit 300. As described with reference to FIG. 7, the latch circuit 300 includes transistors M21 to M24 and a capacitive element Cb. In FIG. 20, layers of the same material are represented by the identical patterns. Specifically, the latch circuit 300 includes a semiconductor layer SC, a first metal layer MT1, and a second metal layer MT2.

Figure 21:
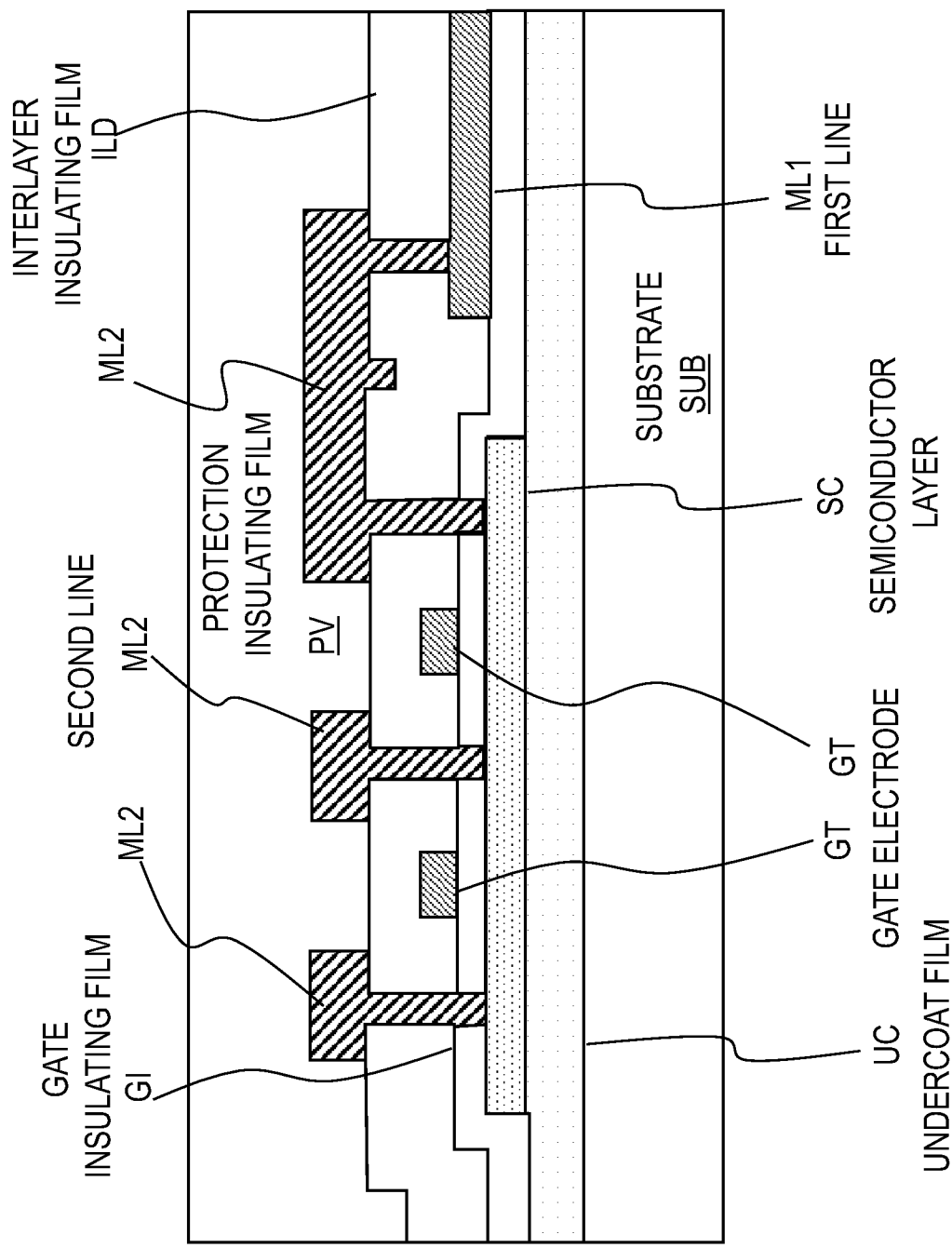
FIG. 21 schematically illustrates a cross-sectional structure along the section line XXI-XXI in FIG. 20.

FIG. 21 schematically illustrates a cross-sectional structure along the section line XXI-XXI in FIG. 20. FIG. 21 illustrates the cross-sectional structure of the transistor M22. An undercoat film UC is provided above an insulating substrate SUB. The undercoat film UC can be a silicon nitride film.

A semiconductor layer SC is provided above the undercoat film UC. The semiconductor layer SC can be polysilicon. In the case where the TFT is of n-type, oxide semiconductor can be used. The semiconductor layer SC is covered with a gate insulating film GI. The gate insulating film GI can be a silicon oxide film, a silicon nitride film, or a stack of these films.

A gate electrode GT and a first line ML1 included in the first metal layer MT1 are provided above the gate insulating film GI. For example, Mo, W, Nb, or Al can be used for the first metal layer MT1.

The first metal layer MT1 and the gate insulating film GI exposed from the first metal layer MT1 are covered with an interlayer insulating film ILD. The interlayer insulating film ILD can be a silicon nitride film or a silicon oxide film. A second line ML2 included in the second metal layer MT2 is provided above the interlayer insulating film ILD.

A part of the second line ML2 is in contact with the semiconductor layer SC via a contact hole opened through the interlayer insulating film ILD and the gate insulating film GI. Another part of the second line ML2 is in contact with the semiconductor layer SC via a contact hole opened through the interlayer insulating film ILD and the gate insulating film GI and further, in contact with the first line ML1 via a contact hole opened through the interlayer insulating film ILD. The whole latch circuit 300 is covered with a protection insulating film PV. The protection insulating film PV can be an inorganic film such as a silicon nitride film or a silicon oxide film.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
a display region including a plurality of pixel circuit rows;
a shift register including a plurality of shift register units connected in series; and
a plurality of latch circuits configured to output signal pulses to the plurality of pixel circuit rows in accordance with a signal input from the shift register,
wherein each of the plurality of latch circuits is configured to output a pulse of a first kind of signal to a pixel circuit row associated with the latch circuit,
wherein the plurality of shift register units are connected with clock signal lines and configured to serially output pulses of a second kind of signal in accordance with input clock signals from the clock signal lines,
wherein each of the plurality of latch circuits is connected with no clock signal lines and configured to receive the pulse of the second kind of signal from a first shift register unit and the pulse of the second kind of signal from a second shift register unit that is two or more later stages than the first shift register unit,
wherein each of the plurality of latch circuits receives no pulse signals other than the pulses of the second kind of signals from the first and the second shift register units, and
wherein the pulse of the first kind of signal from each of the plurality of latch circuits changes from a first potential level to a second potential level in response to the pulse of the second kind of signal from the first shift register unit and changes from the second potential level to the first potential level in response to the pulse of the second kind of signal from the second shift register unit.

2. The display device according to claim 1,
wherein an output from the N-th stage of latch circuit is set by the pulse of the second kind of signal from the K-th stage of shift register unit and reset by the pulse of the second kind of signal from the (K+p)th stage of shift register unit,
wherein an output from the (N+q)th stage of latch circuit is set by the pulse of the second kind of signal from the (K+q)th stage of shift register unit and reset by the pulse of the second kind of signal from the (K+q+p)th stage of shift register unit,
wherein the pulse of the first kind of signal from each latch circuit has a pulse width of H*p,
wherein the pulse of the first kind of signal from the (N+q)th stage of latch circuit is delayed from the pulse of the first kind of signal from the N-th stage of latch circuit by H*q, and
wherein N is an integer, K is an integer, p is an integer greater than 1, q is an integer greater than 0, and H is a pulse width from the shift register.

3. The display device according to claim 1,
wherein an output from the N-th stage of latch circuit is reset by pulse of the second kind of signal from the K-th stage of shift register unit and set by the pulse of the second kind of signal from the (K+p)th stage of shift register unit,
wherein an output from the (N+q)th stage of latch circuit is reset by the pulse of the second kind of signal from the (K+q)th stage of shift register unit and set by the pulse of the second kind of signal from the (K+q+p)th stage of shift register unit,
wherein the pulse of the first kind of signal from each latch circuit have a pulse width of H*p,
wherein the pulse of the first kind of signal from the (N+q)th stage of latch circuit is delayed from the pulse of the first kind of signal from the N-th stage of latch circuit by H*q, and
wherein N is an integer, K is an integer, p is an integer greater than 1, q is an integer greater than 0, and H is a pulse width from the shift register.

4. The display device according to claim 1,
wherein each of the plurality of shift register units is configured to output a pulse of the second kind of signal to a pixel circuit row associated with the shift register unit, and
wherein the shift register is configured to output the pulses of the second kind of signal serially to the plurality of pixel circuit rows.

5. The display device according to claim 4,
wherein the pulse of the first kind of signal controls a period of threshold compensation for a driving transistor in a pixel circuit, and
wherein the pulse of the second kind of signal controls a period of data write to the pixel circuit.

6. The display device according to claim 5, further comprising:
transmission lines each provided to transmit the pulse of the first kind of signal from a latch circuit to the associated pixel circuit row; and
switch transistors each disposed between each of the lines and a power line provided to supply a potential of the first potential level,
wherein a gate electrode of each of the switch transistors is connected with an emission signal line provided to supply a signal controlling whether to supply a driving current to a light-emitting element included in the pixel circuit, and
wherein the each of the switch transistor is turned on after the pulse of the first kind of signal ends to supply the first potential level from the power line to each of the transmission lines.

7. The display device according to claim 4,
wherein the pulse of the first kind of signal controls whether to supply a driving current to a light-emitting element in a pixel circuit, and
wherein the pulse of the second kind of signal controls a period of data write to the pixel circuit.

8. The display device according to claim 7, wherein an output pulse of each of the plurality of shift register units is the pulse of the second kind of signal for a pixel circuit row associated with the shift register unit and also a pulse of a third kind of signal for another pixel circuit row associated with the shift register unit.

9. The display device according to claim 1, wherein the plurality of latch circuits are disposed between the shift register and the display region.

10. A display device comprising:
a display region; and
a driving circuit for the display region disposed outside the display region,
wherein the display region includes:
a plurality of pixel circuits; and
a plurality of first control lines, a plurality of second control lines, a plurality of signal lines, and a plurality of power lines connected with the plurality of pixel circuits,
wherein each of the plurality of pixel circuits includes:
a light-emitting element;
a plurality of switch transistors of a first conductive type;
an emission control transistor of a second conductive type, the emission control transistor being configured to control ON/OFF of light emission of the light-emitting element;
a driving transistor of the second conductive type, the driving transistor being configured to control amount of electric current to the light-emitting element; and
a storage capacitor connected with the driving transistor,
wherein the plurality of first control lines are configured to transmit a first control signal from the driving circuit to the plurality of switch transistors of the first conductive type,
wherein the plurality of second control lines are configured to transmit a second control signal from the driving circuit to the emission control transistors of the second conductive type,
wherein the driving circuit includes a plurality of transistors, a plurality of capacitors, and a plurality of connection lines,
wherein all transistors included in the driving circuit are transistors of the first conductive type,
wherein the driving circuit includes a plurality of shift register units and a plurality of latch circuits,
wherein each of the plurality of latch circuits is configured to output a pulse of a first kind of signal to a pixel circuit row associated with the latch circuit,
wherein the plurality of shift register units are connected with clock signal lines and configured to serially output pulses of a second kind of signal in accordance with input clock signals from the clock signal lines,
wherein each of the plurality of latch circuits is connected with no clock signal lines and configured to receive the pulse of the second kind of signal from a first shift register unit and the pulse of the second kind of signal from a second shift register unit of a later stage than the first shift register unit,
wherein each of the plurality of latch circuits receives no pulse signals other than the pulses of the second kind of signals from the first and the second shift register units, and
wherein the pulse of the first kind of signal from each of the plurality of latch circuits changes from a first potential level to a second potential level in response to the pulse of the second kind of signal from the first shift register unit and changes from the second potential level to the first potential level in response to the pulse of the second kind of signal from the second shift register unit.

11. A display device comprising:
a display region; and
a driving circuit for the display region disposed outside the display region,
wherein the display region includes:
a plurality of pixel circuits; and
a plurality of first control lines, a plurality of second control lines, a plurality of signal lines, and a plurality of power lines connected with the plurality of pixel circuits,
wherein each of the plurality of pixel circuits includes:
a light-emitting element;
a plurality of n-type switch transistors;
a p-type emission control transistor, the emission control transistor being configured to control ON/OFF of light emission of the light-emitting element;
a p-type driving transistor of, the driving transistor being configured to control amount of electric current to the light-emitting element; and
a storage capacitor connected with the driving transistor,
wherein the plurality of first control lines are configured to transmit a first control signal from the driving circuit to the plurality of n-type switch transistors,
wherein the plurality of second control lines are configured to transmit a second control signal from the driving circuit to the p-type emission control transistors,
wherein the driving circuit includes a plurality of transistors, a plurality of capacitors, and a plurality of connection lines,
wherein all transistors included in the driving circuit are n-type transistors, and
wherein the driving circuit includes:
a plurality of shift register units connected with clock signal lines and configured to serially output pulses in accordance with input clock signals from the clock signal lines, wherein each of the plurality of latch circuits receives no pulse signals other than the pulses of the second kind of signals from the first and the second shift register units, and a plurality of latch circuits connected with no clock signal lines and configured to output pulses to pixel circuit rows in accordance with pulses from the plurality of shift register units.

* * * * *